United States Patent
Chen et al.

(10) Patent No.: US 12,272,771 B2
(45) Date of Patent: Apr. 8, 2025

(54) DISPLAY PANEL AND MANUFACTURING METHOD THEREOF

(71) Applicant: Au Optronics Corporation, Hsinchu (TW)

(72) Inventors: Ming-Lung Chen, Hsinchu (TW); Kun-Cheng Tien, Hsinchu (TW); Chien-Huang Liao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 649 days.

(21) Appl. No.: 17/515,566

(22) Filed: Nov. 1, 2021

(65) Prior Publication Data

US 2023/0030752 A1   Feb. 2, 2023

(30) Foreign Application Priority Data

Jul. 28, 2021   (TW) .................................. 110127792

(51) Int. Cl.
*H01L 33/46*   (2010.01)
*H01L 33/00*   (2010.01)
*H01L 33/54*   (2010.01)

(52) U.S. Cl.
CPC ............ *H01L 33/46* (2013.01); *H01L 33/005* (2013.01); *H01L 33/54* (2013.01); *H01L 2933/0025* (2013.01); *H01L 2933/005* (2013.01)

(58) Field of Classification Search
None
See application file for complete search history.

(56) References Cited

U.S. PATENT DOCUMENTS

| | | |
|---|---|---|
| 9,024,340 B2 | 5/2015 | Minato et al. |
| 9,853,194 B2 | 12/2017 | Minato et al. |
| 10,073,294 B1 | 9/2018 | In et al. |
| 10,234,722 B2 | 3/2019 | Lin et al. |
| 10,522,727 B2 | 12/2019 | Minato et al. |
| 10,854,695 B2 | 12/2020 | Tang et al. |
| 11,048,117 B2 | 6/2021 | In et al. |
| 11,133,431 B2 | 9/2021 | Ota et al. |

(Continued)

FOREIGN PATENT DOCUMENTS

| | | |
|---|---|---|
| CN | 101878540 | 11/2010 |
| CN | 107731863 | 2/2018 |

(Continued)

*Primary Examiner* — Robert K Carpenter
(74) *Attorney, Agent, or Firm* — JCIPRNET

(57) ABSTRACT

A display panel, including a circuit substrate, a light emitting diode, and a reflective layer, is provided. The light emitting diode includes a light emitting layer and first and second semiconductor layers. The light emitting layer is located between the first and second semiconductor layers. The second semiconductor layer is located between the first semiconductor layer and the circuit substrate. The reflective layer is in contact with a part of a side surface of the light emitting diode. A part of the reflective layer is located between the light emitting diode and the circuit substrate. Taking a direction perpendicular to a top surface of the circuit substrate as a height direction, a horizontal height of a top surface of the reflective layer is located between a horizontal height of a top surface of the light emitting layer and a horizontal height of a top surface of the light emitting diode.

20 Claims, 21 Drawing Sheets

(56) References Cited

U.S. PATENT DOCUMENTS

| | | |
|---|---|---|
| 11,194,191 B2 | 12/2021 | Wu et al. |
| 11,257,996 B2 | 2/2022 | Minato et al. |
| 2010/0320479 A1 | 12/2010 | Minato et al. |
| 2012/0138981 A1* | 6/2012 | Chen ................. H01L 33/58 |
| | | 257/E33.056 |
| 2015/0287896 A1 | 10/2015 | Minato et al. |
| 2017/0207249 A1* | 7/2017 | Rhee .................. H10K 59/131 |
| 2018/0069164 A1 | 3/2018 | Minato et al. |
| 2018/0284501 A1 | 10/2018 | Lin et al. |
| 2018/0284934 A1 | 10/2018 | Wu et al. |
| 2019/0004347 A1 | 1/2019 | Lin et al. |
| 2019/0162992 A1 | 5/2019 | Lin et al. |
| 2020/0067009 A1 | 2/2020 | Wu et al. |
| 2020/0098960 A1 | 3/2020 | Minato et al. |
| 2020/0161499 A1 | 5/2020 | Ota et al. |
| 2020/0235177 A1 | 7/2020 | Tang et al. |
| 2020/0257146 A1 | 8/2020 | Wu et al. |
| 2020/0373469 A1 | 11/2020 | Chen et al. |
| 2021/0286207 A1 | 9/2021 | Lin et al. |
| 2022/0066247 A1 | 3/2022 | Wu et al. |
| 2022/0131048 A1* | 4/2022 | Andrews ............. H01L 33/005 |
| 2022/0140212 A1 | 5/2022 | Minato et al. |

FOREIGN PATENT DOCUMENTS

| | | |
|---|---|---|
| CN | 108666338 | 10/2018 |
| CN | 110858599 | 3/2020 |
| CN | 111987080 | 11/2020 |
| CN | 112997323 | 6/2021 |
| WO | 2020107724 | 6/2020 |

\* cited by examiner

DISPLAY PANEL AND MANUFACTURING METHOD THEREOF

CROSS-REFERENCE TO RELATED APPLICATION

This application claims the priority benefit of Taiwan application serial no. 110127792, filed on Jul. 28, 2021. The entirety of the above-mentioned patent application is hereby incorporated by reference herein and made a part of this specification.

BACKGROUND

Technical Field

The disclosure relates to a display panel, and particularly relates to a display panel including a light emitting diode and a manufacturing method thereof.

Description of Related Art

The light emitting diode is an electroluminescent semiconductor element, which has advantages such as long life, not easy to break, fast response speed, and high reliability. With the advancement of semiconductor processes, the size of the light emitting layer of the light emitting diode has been shrinking year by year. However, the metal electrode of the light emitting diode limits the area of the light emitting layer of the light emitting diode, so that the effective light emitting area of the small-sized light emitting diode (for example, a micro-light emitting diode) is insufficient, thereby causing the brightness of the display device to be insufficient.

SUMMARY

The disclosure provides a display panel, which can improve the issue of insufficient brightness of the display panel.

The disclosure provides a manufacturing method of a display panel, which can improve the issue of insufficient brightness of the display panel.

At least one embodiment of the disclosure provides a display panel. The display panel includes a circuit substrate, a light emitting diode, and a reflective layer. The light emitting diode includes a first semiconductor layer, a light emitting layer, and a second semiconductor layer. The light emitting layer is located between the first semiconductor layer and the second semiconductor layer. The second semiconductor layer is located between the first semiconductor layer and the circuit substrate. The reflective layer is in contact with a part of a side surface of the light emitting diode. A part of the reflective layer is located between the light emitting diode and the circuit substrate. Taking a direction perpendicular to a top surface of the circuit substrate as a height direction, a horizontal height of a top surface of the reflective layer is located between a horizontal height of a top surface of the light emitting layer and a horizontal height of a top surface of the light emitting diode.

At least one embodiment of the disclosure provides a manufacturing method of a display panel, which includes the following steps. A circuit substrate is provided. A light emitting diode is placed on the circuit substrate. The light emitting diode includes a first semiconductor layer, a light emitting layer, and a second semiconductor layer. The light emitting layer is located between the first semiconductor layer and the second semiconductor layer, and the second semiconductor layer is located between the first semiconductor layer and the circuit substrate. Before or after placing the light emitting diode on the circuit substrate, a reflective layer is formed on the circuit substrate. Taking a direction perpendicular to a top surface of the circuit substrate as a height direction, a horizontal height of a top surface of the reflective layer is located between a horizontal height of a top surface of the light emitting layer and a horizontal height of a top surface of the light emitting diode. The reflective layer is in contact with a part of a side surface of the light emitting diode, and a part of the reflective layer is located between the light emitting diode and the circuit substrate.

Based on the above, by the configuration of the reflective layer, the luminous efficiency of the display panel can be improved.

DETAILED DESCRIPTION OF DISCLOSED EMBODIMENTS

Figure 1:
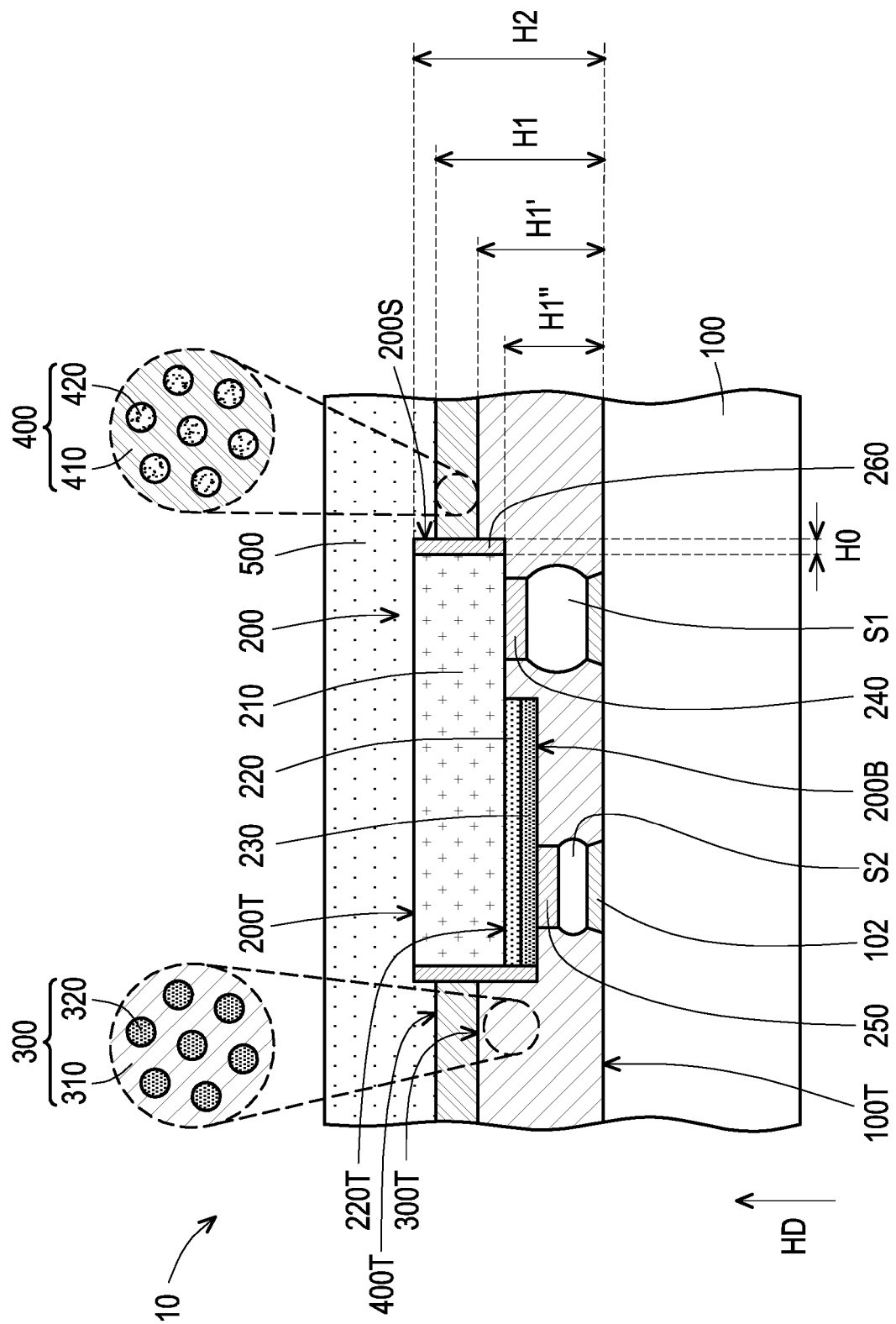
FIG. 1 is a cross-sectional schematic view of a display panel according to an embodiment of the disclosure.

FIG. 1 is a cross-sectional schematic view of a display panel according to an embodiment of the disclosure.

Please refer to FIG. 1. A display panel 10 includes a circuit substrate 100, a light emitting diode 200, and a reflective layer 300. In the embodiment, the display panel 10 further includes a light absorbing layer 400 and an encapsulating layer 500.

The circuit substrate 100 has multiple pads 102 located on a top surface 100T thereof. In some embodiments, the circuit substrate 100 includes a substrate and an active element (not shown), a passive element (not shown), a signal line (not shown), an insulating layer (not shown), and the pads 102 formed on the substrate. The substrate is a soft substrate or a rigid substrate. For example, the substrate includes glass, quartz, organic polymer, wafer, ceramic, or other applicable materials.

The light emitting diode 200 includes a first semiconductor layer 210, a light emitting layer 220, and a second semiconductor layer 230. In the embodiment, the light emitting diode 200 further includes a first electrode 240, a second electrode 250, and an insulating layer 260.

The light emitting diode 200 includes a first semiconductor layer 210, a light emitting layer 220, and a second semiconductor layer 230 stacked sequentially. The light emitting layer 220 is located between the first semiconductor layer 210 and the second semiconductor layer 230. The second semiconductor layer 230 is located between the first semiconductor layer 210 and the circuit substrate 100. In the embodiment, an area of a vertical projection of the first semiconductor layer 210 on the circuit substrate 100 is greater than an area of a vertical projection of the second semiconductor layer 230 on the circuit substrate 100. An area of a vertical projection of the light emitting layer 220 on the circuit substrate 100 is equal to the area of the vertical projection of the second semiconductor layer 230 on the circuit substrate 100.

One of the first semiconductor layer 210 and the second semiconductor layer 230 is an n-type doped semiconductor, and the other one is a p-type doped semiconductor. The materials of the first semiconductor layer 210 and the second semiconductor layer 230 include, for example, GaN, InGaN, GaAs, AlGaInP, other materials composed of IIIA group and VA group elements, or other suitable materials, but the disclosure is not limited thereto. The light emitting layer 220 has, for example, a quantum well (QW), such as a single quantum well (SQW), a multiple quantum well (MQW), or other quantum wells. Electron hole provided by the p-type doped semiconductor layer and electrons provided by the n-type doped semiconductor layer may be combined in the light emitting layer 220 and release energy in a light mode. In some embodiments, the material of the light emitting layer 220 includes, for example, GaN, InGaN, GaAs, AlGaInP, InAlGaAs, other materials composed of IIIA group and VA group elements, or other suitable materials.

The first electrode 240 and the second electrode 250 are respectively electrically connected to the first semiconductor layer 210 and the second semiconductor layer 230. The first electrode 240 and the second electrode 250 each has a single-layer or multi-layer structure. In the embodiment, the first electrode 240 and the second electrode 250 are respectively electrically connected to the corresponding pads 102 through a first connecting structure S1 and a second connecting structure S2. The first connecting structure S1 and the second connecting structure S2 are, for example, solder, and include tin, indium, bismuth, tin-bismuth mixed metal, tin-indium mixed metal, tin-copper mixed metal, tin-silver mixed metal, tin-antimony mixed metal, tin-zinc mixed metal, tin-silver-copper mixed metal, tin-silver-copper-bismuth mixed metal, or a combination of the foregoing materials. In some embodiments, the method for forming the first connecting structure S1 and the second connecting structure S2 includes vapor deposition, electroplating, printing, ball mounting, or other suitable processes. In some embodiments, after respectively forming the first connecting structure S1 and the second connecting structure S2 on the first electrode 240 and the second electrode 250, the light emitting diode 200 is placed on the circuit substrate 100, but the disclosure is not limited thereto. In other embodiments, after forming the first connecting structure S1 and the second connecting structure S2 on the pads 102 of the circuit substrate 100, the light emitting diode 200 is placed on the circuit substrate 100. The first connecting structure S1 and the second connecting structure S2 are heated through laser, hot pressing, or other manners, so that the light emitting diode 200 is bonded to the circuit substrate 100. In other embodiments, the light emitting diode 200 is bonded to the circuit substrate 100 through other conductive connecting structures (for example, anisotropic conductive adhesive). In this case, the first connecting structure S1 and the second connecting structure S2 may be omitted.

The insulating layer 260 is located on a side wall 200S of the light emitting diode 200. For example, the insulating layer 260 is located on a side wall of the first semiconductor layer 210, a side wall of the light emitting layer 220, and a side wall of the second semiconductor layer 230. The insulating layer 260 has the functions of insulation and reflection, and helps guide light to a top surface of the light emitting diode 200. In some embodiments, the insulating layer 260 can prevent the reflective layer 300 from contacting the side walls of the first semiconductor layer 210, the light emitting layer 220, and the second semiconductor layer 230, thereby reducing the negative impact of the reflective layer 300 on the luminous efficiency of the light emitting diode 200. In some embodiments, a thickness H0 of the insulating layer 260 is 0.01 μm to 2 μm. In some embodiments, the insulating layer 260 includes a distributed Bragg reflector (DBR), AlN, $Al_2O_3$, or other suitable materials. In some embodiments, the insulating layer 260 may be used as a repair layer for repairing damage to semiconductor materials or as a reflective layer for reflecting rays.

The reflective layer 300 is located on the circuit substrate 100. The reflective layer 300 includes a first base material 310 and multiple reflective microstructures 320. The first base material 310 is, for example, a solid organic material. For example, the first base material 310 is solid epoxy, silicone, or other elastic materials. The reflective microstructures 320 are distributed in the first base material 310. The reflective microstructures 310 include porous inorganic particles, hollow polymer particles, or air. In some embodiments, the reflective microstructures 310 are porous (or air-containing) $SiO_2$, $TiO_2$, $Al_2O_3$, $CaCO_3$, $BaSO_4$, or other materials. In some embodiments, the reflective microstructures 310 are hollow polymer particles, and polymer shells thereof include polystyrene (PS), poly(methyl methacrylate) (PMMA), polycarbonate (PC), modified silicone (MS), or other materials. The reflectivity of the reflective layer 300 is positively correlated with the concentration of reflective particles and the thickness of the reflective layer. In the embodiment, the reflectivity of the reflective layer 300 to visible light is greater than 50%.

In the embodiment, the reflective layer 300 is in contact with a part of the side surface 200S of the light emitting diode 200. A part of the reflective layer 300 is located between a bottom surface 200B of the light emitting diode 200 and the top surface 100T of the circuit substrate 100. In some embodiments, the particle size of the reflective microstructure 320 is 0.1 μm to 2 μm. The particle size of the reflective microstructure 320 is less than a gap between the light emitting diode 200 and the circuit substrate 100. Therefore, the reflective microstructure 320 may be filled between the light emitting diode 200 and the circuit substrate 100.

Taking a direction HD perpendicular to the top surface 100T of the circuit substrate 100 as a height direction, a horizontal height of a top surface 300T of the reflective layer 300 is located between a horizontal height of a top surface 220T of the light emitting layer 220 and a horizontal height of a top surface 200T of the light emitting diode 200 (that is, a top surface of the first semiconductor layer in the embodiment). Based on this, the reflective layer 300 may effectively reflect rays emitted by the light emitting layer 220, thereby improving the luminous efficiency of the light emitting diode 200.

The light absorbing layer 400 is located on the top surface 300T of the reflective layer 300. In the embodiment, the light absorbing layer 400 and the reflective layer 300 are both in contact with the side surface 200S of the light emitting diode 200. The light absorbing layer 400 includes a second base material 410 and multiple light absorbing particles 420. The second base material 410 includes a material the same as or different from the first base material 310. For example, the second base material 410 is solid epoxy, silicone, or other elastic materials. The light absorbing particles 420 are distributed in the second base material 410.

In some embodiments, the light absorbing particles 420 include carbon, chromium, light absorbing dyes similar to filter elements, or other light absorbing materials. In the embodiment, the reflectivity of the reflective layer 300 to visible light is greater than the reflectivity of the light absorbing layer 400. In some embodiments, the transmittance of the light absorbing layer 400 is less than 20%.

In some embodiments, a vertical distance between the top surface 400T of the light absorbing layer 400 and the top surface 100T of the circuit substrate 100 is H1. The vertical distance H1 is greater than the thickness H0 of the insulating layer 260. In some embodiments, the vertical distance H1 is 3 µm to 15 µm. A vertical distance between the top surface 300T of the reflective layer 300 and the top surface 100T of the circuit substrate 100 is H1'. The vertical distance H1 is greater than the vertical distance H1'. A vertical distance between the top surface 220T of the light emitting layer 220 and the top surface 100T of the circuit substrate 100 is H1". The vertical distance H1' is greater than the vertical distance H1".

A vertical distance between the top surface 200T of the light emitting diode 200 and the top surface 100T of the circuit substrate 100 is H2. In some embodiments, the vertical distance H2 is 7 µm to 10 µm. In some embodiments, 20%≤H1/H2≤150%, thereby improving the efficiency of the light emitting diode 200. In a case where the vertical distance H1 is greater than the vertical distance H2 (that is, 100%≤H1/H2≤150%), the light absorbing layer 400 has openings (not shown) exposing the top surface 200T of the light emitting diode 200, and the openings prevent the top surface 200T of the light emitting diode 200 from being completely covered by the light absorbing layer 400. For example, in the case where the vertical distance H1 is greater than the vertical distance H2, an area of the top surface 200T of the light emitting diode 200 covered by the light absorbing layer 400 does not exceed 50% of the entire top surface 200T. In addition, if H1/H2 is less than 20%, the process precision requirement of the light absorbing layer 400 needs to be very high. If the light absorbing layer 400 is too thin, the reflective layer 300 under the light absorbing layer 400 may be easily exposed, which causes the reflective layer 300 to reflect external ambient light and affects the quality of a display image.

The encapsulating layer 500 is located on the light absorbing layer 400. In some embodiments, the encapsulating layer 500 includes a material the same as or different from the first base material 310 and/or the second base material 410. In some embodiments, 0≤the transmittance of the light absorbing layer 400/the transmittance of the encapsulating layer 500<40%. In a preferred embodiment, the transmittance of the encapsulating layer 500 to visible light is greater than the transmittance of the light absorbing layer 400 to visible light and the transmittance of the reflective layer 300 to visible light. In some embodiments, the transmittance of the encapsulating layer 500 is greater than 50%.

FIG. 2A to FIG. 2F are cross-sectional schematic views of a manufacturing method of the display panel 10 according to an embodiment of the disclosure. It must be noted here that the embodiment of FIG. 2A to FIG. 2F continues to use the reference numerals and some content of the embodiment of FIG. 1, wherein the same or similar reference numerals are adopted to denote the same or similar elements, and the description of the same technical content is omitted. For the description of the omitted parts, reference may be made to the foregoing embodiment, which will not be repeated here.

Figure 2A:
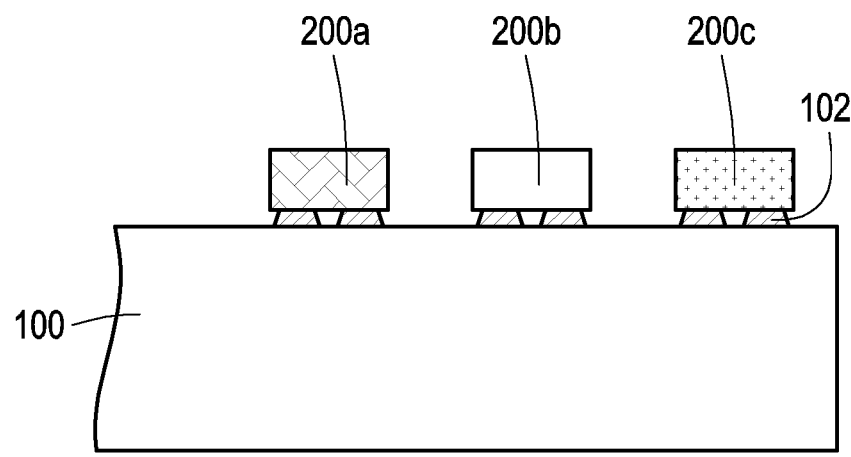
FIG. 2A to FIG. 2F are cross-sectional schematic views of a manufacturing method of a display panel according to an embodiment of the disclosure.

Please refer to FIG. 2A. The circuit substrate 100 is provided. Light emitting diodes 200a, 200b, and 200c are placed on the circuit substrate 100. For example, the light emitting diodes 200a, 200b, and 200c are transferred from a growth substrate or an intermediate substrate to the circuit substrate 100 through mass transfer. The light emitting diodes 200a, 200b, and 200c are electrically connected to the pads 102 of the circuit substrate 100.

Each of the light emitting diodes 200a, 200b, and 200c includes a first semiconductor layer, a light emitting layer, and a second semiconductor layer, wherein the light emitting layer is located between the first semiconductor layer and the second semiconductor layer, and the second semiconductor layer is located between the first semiconductor layer and the circuit substrate 100. For the convenience of description, FIG. 2A to FIG. 2F omit the illustration of specific structures of the light emitting diodes 200a, 200b, and 200c. For the structures of the light emitting diodes 200a, 200b, and 200c, reference may be made to the structure of the light emitting diode 200 of FIG. 1, which will not be repeated here. The light emitting diodes 200a, 200b, and 200c are respectively, for example, light emitting diodes with different colors. For example, the light emitting diodes 200a, 200b, and 200c are respectively a red light emitting diode, a green light emitting diode, and a blue light emitting diode, but the disclosure is not limited thereto. In other embodiments, the light emitting diodes 200a, 200b, and 200c are light emitting diodes with other colors.

Figure 2B:
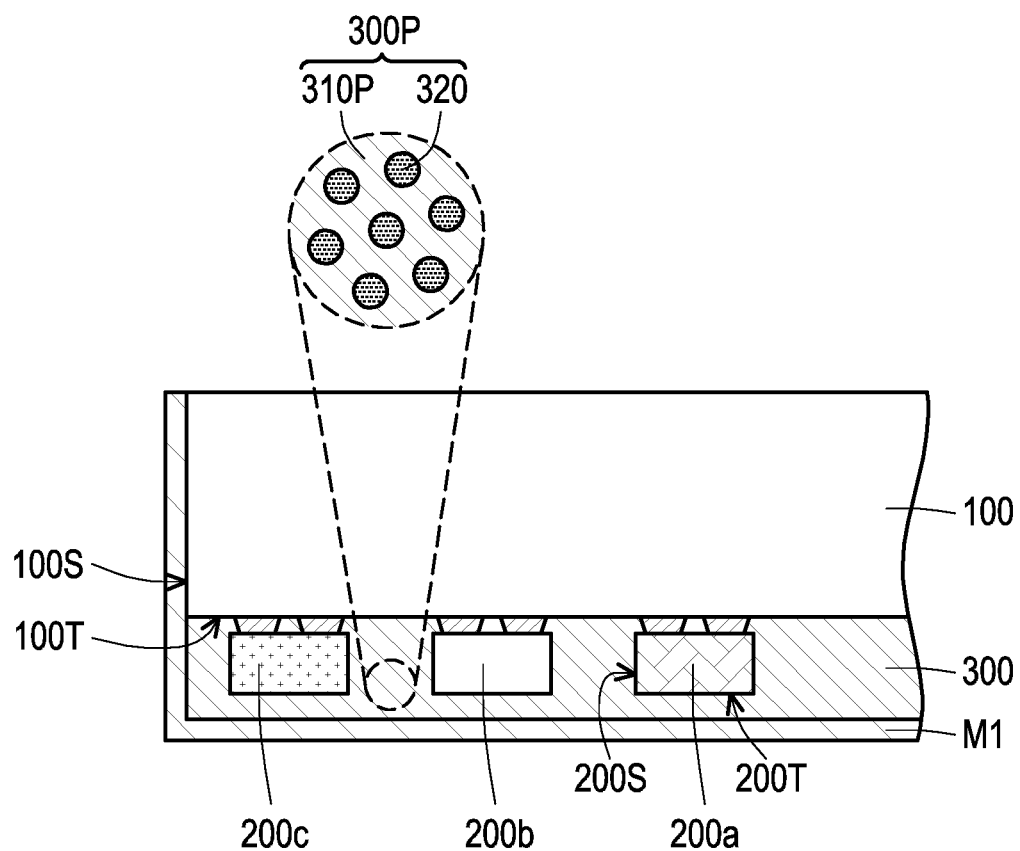
Figure 2C:
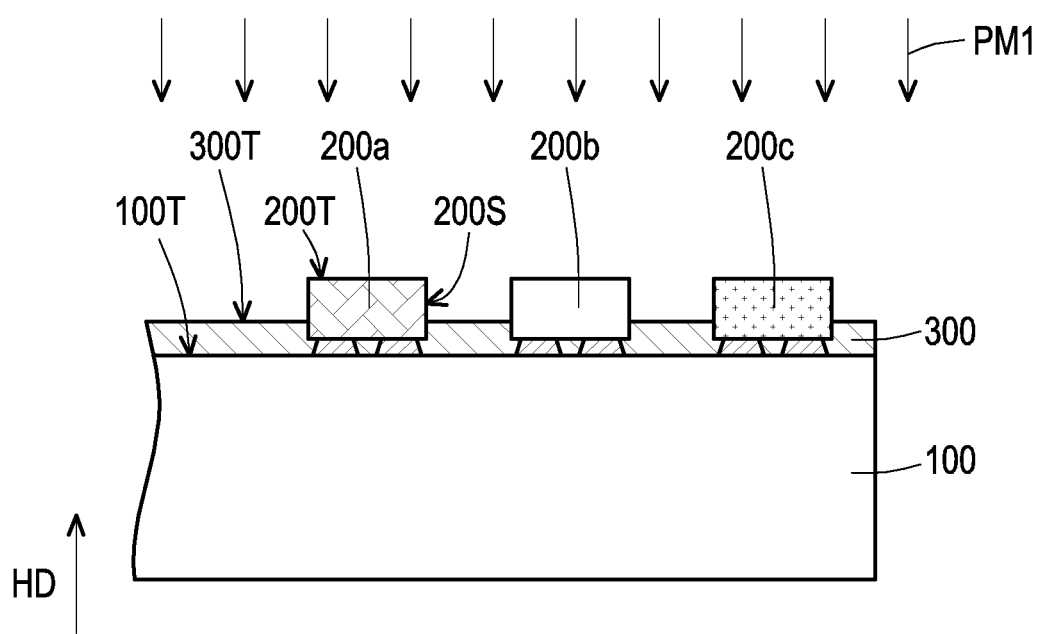

Please refer to FIG. 2B and FIG. 2C. The reflective layer 300 is formed on the circuit substrate 100.

Please refer to FIG. 2B first. After placing the light emitting diodes 200a, 200b, and 200c on the circuit substrate 100, the light emitting diodes 200a, 200b, and 200c and the circuit substrate 100 are placed in a first mold M1. A reflective material 300P is filled in the first mold M1. The reflective material 300P is coated around the light emitting diodes 200a, 200b, and 200c. For example, the reflective material 300P is coated around the top surfaces 200T and the side surfaces 200S of the light emitting diodes 200a, 200b, and 200c.

In the embodiment, the reflective material 300P includes a first base material 310P and the reflective microstructures 320. The first base material 310P is, for example, a colloidal or liquid organic material. For example, the first base material 310P includes epoxy, silicone, organic solvent, and/or other materials. The reflective microstructures 320 are distributed in the first base material 310P. The reflective microstructures 310 include porous inorganic particles or hollow polymer particles.

In the embodiment, the reflective material 300P is only formed on the top surface 100T of the circuit substrate 100 corresponding to the light emitting diodes 200a, 200b, and 200c, but the disclosure is not limited thereto. In other embodiments, the reflective material 300P is also formed on a side surface 100S of the circuit substrate 100.

The reflective material 300P is cured. For example, the first base material 310P is cured at high temperature or normal temperature.

Please refer to FIG. 2C. After curing the reflective material 300P, the first mold M1 is removed. In the embodiment, after removing the first mold M1, the cured reflective material 300P covers the top surfaces 200T of the light emitting diodes 200a, 200b, and 200c. An etching process PM1 is executed on the cured reflective material 300P to form the reflective layer 300 exposing the top surfaces 200T of the light emitting diodes 200a, 200b, and 200c. In some embodiments, the etching process PM1 includes, for example, a plasma etching process. In the embodiment, the reflective layer 300 also exposes a part of the side surfaces 200S of the light emitting diodes 200a, 200b, and 200c.

In some embodiments, when the reflective microstructures 320 in the reflective material 300P are inorganic materials, a part of the reflective microstructures 320 will remain on the top surfaces 200T of the light emitting diodes 200a, 200b, and 200c and the top surface 300T of the reflective layer 300 after executing the etching process PM1. Therefore, after executing the etching process PM1, a cleaning process is selectively executed on the top surfaces 200T of the light emitting diodes 200a, 200b, and 200c and the top surface 300T of the reflective layer 300 to remove the redundant reflective microstructures 320.

In the embodiment, taking the direction HD perpendicular to the top surface 100T of the circuit substrate 100 as the height direction, a horizontal height of the top surface 300T of the reflective layer 300 is located between a horizontal height of a top surface of a light emitting layer of the light emitting diodes 200a, 200b, and 200c and a horizontal height of the top surfaces 200T of the light emitting diodes 200a, 200b, and 200c, wherein the reflective layer 300 is in contact with a part of the side surfaces 200S of the light emitting diodes 200a, 200b, and 200c, and a part of the reflective layer 300 is located between the light emitting diodes 200a, 200b, and 200c and the circuit substrate 100.

Figure 2D:
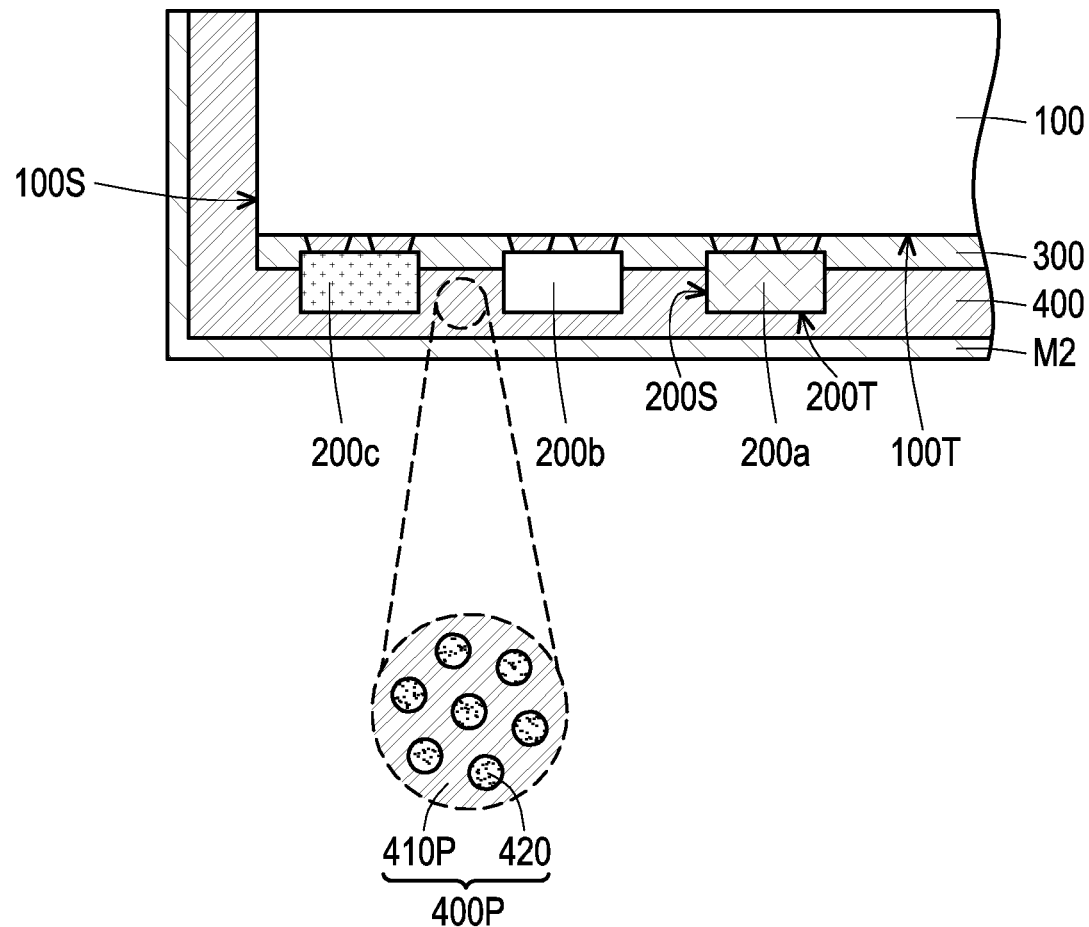
Figure 2E:
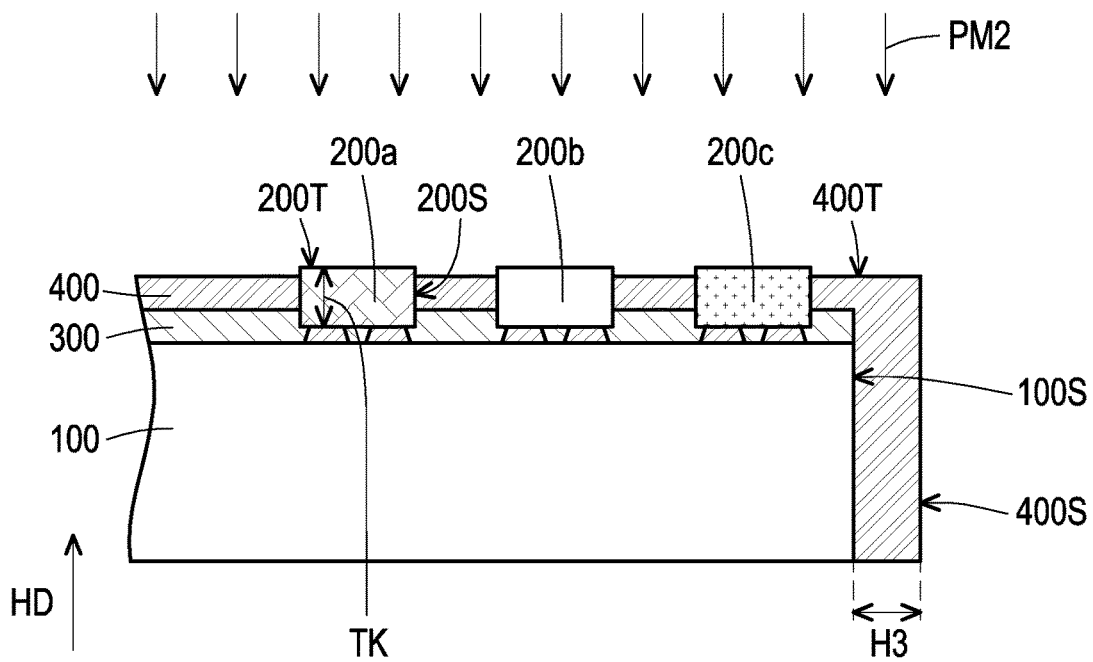

Please refer to FIG. 2D and FIG. 2E. The light absorbing layer 400 is formed on the reflective layer 300.

Please refer to FIG. 2D first. The light emitting diodes 200a, 200b, and 200c, the reflective layer 300, and the circuit substrate 100 are placed in a second mold M2. A light absorbing material 400P is filled in the second mold M2. The light absorbing material 400P is coated around the light emitting diodes 200a, 200b, and 200c. For example, the light absorbing material 400P is coated around the top surfaces 200T and the side surfaces 200S of the light emitting diodes 200a, 200b, and 200c.

The light absorbing material 400P includes a second base material 410P and the light absorbing particles 420. The second base material 410P includes a material the same as or different from the first base material 310P. The second base material 410P is a colloidal or liquid organic material. For example, the second base material 410P includes epoxy, silicone, organic solvent, and/or other materials. The light absorbing particles 420 are distributed in the second base material 410P. In some embodiments, the light absorbing particles 420 include carbon, chromium, light absorbing dyes similar to filter elements, or other light absorbing materials.

In the embodiment, the light absorbing material 400P is formed on the top surface 100T of the circuit substrate 100 and the side surface 100S of the circuit substrate 100. The reflective layer 300 is located between the light absorbing material 400P and the top surface 100T of the circuit substrate 100. In some embodiments, the reflective layer 300 is also located between the light absorbing material 400P and the side surface 100S of the circuit substrate 100.

The light absorbing material 400P is cured. For example, the second base material 410P is cured at high temperature or normal temperature.

Please refer to FIG. 2E. After curing the light absorbing material 400P, the second mold M2 is removed. In the embodiment, after removing the second mold M2, the cured light absorbing material 400P covers the top surfaces 200T of the light emitting diodes 200a, 200b, and 200c. An etching process PM2 is executed on the cured reflective material 400P to form the light absorbing layer 400 exposing the top surfaces 200T of the light emitting diodes 200a, 200b, and 200c. In some embodiments, the etching process PM2 includes, for example, a plasma etching process. In the embodiment, the light absorbing layer 400 also exposes a part of the side surfaces 200S of the light emitting diodes 200a, 200b, and 200c.

In some embodiments, when the light absorbing particles 420 in the light absorbing material 400P are inorganic materials, a part of the light absorbing particles 420 will remain on the top surfaces 200T of the light emitting diodes 200a, 200b, and 200c and the top surface 400T of the light absorbing layer 400 after executing the etching process PM2. Therefore, a cleaning process is executed on the top surfaces 200T of the light emitting diodes 200a, 200b, and 200c and the top surface 400T of the light absorbing layer 400 to remove the redundant light absorbing particles 420.

In the embodiment, the light absorbing layer 400 and the reflective layer 300 are in contact with the side surfaces 200S of the light emitting diodes 200a, 200b, and 200c. The light absorbing layer 400 covers at least part of the side surface 100S of the circuit substrate 100. A vertical distance between the side surface 400S of the light absorbing layer 400 and the side surface 100S of the circuit substrate 100 is H3. In some embodiments, the vertical distance H3 is greater than a thickness TK of the light emitting diodes 200a, 200b, and 200c. In some embodiments, the vertical distance H3 is 10 μm to 100 μm.

Figure 2F:
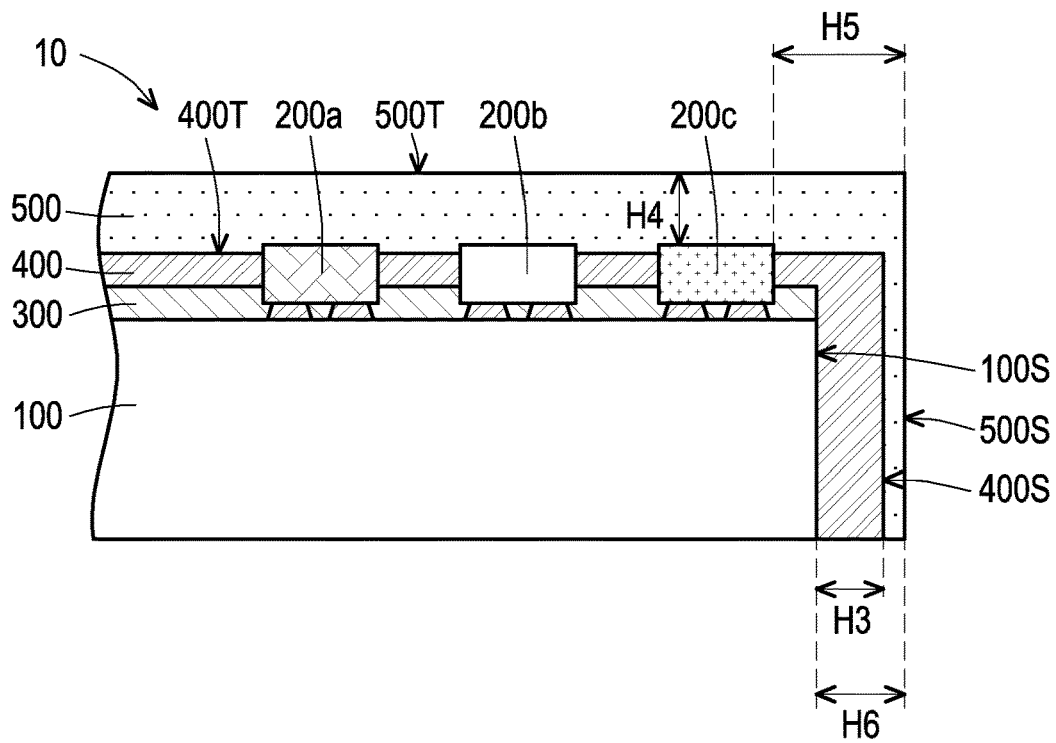

Please refer to FIG. 2F. The encapsulating layer 500 is selectively formed on the light absorbing layer 400. In some embodiments, the method for forming the encapsulating layer 500 includes, for example, a molding process (for example, similar to the processes of FIG. 2B and FIG. 2D). In some embodiments, a side surface 500S of the encapsulating layer 500 is cut, so that the side surface 500S of the encapsulating layer 500 becomes a relatively flat surface. So far, the display panel 10 is roughly completed. In some embodiments, an encapsulating material is formed on the circuit substrate 100. Then, the encapsulating material is cropped to form the encapsulating layer 500, and the cropping surface is the side surface 500S of the encapsulating layer 500. In the embodiment, the light absorbing layer 400 completely covers a side surface of the reflective layer 300, so that the side surface of the reflective layer 300 is not exposed.

In some embodiments, the encapsulating layer 500 also contains a small amount of light absorbing particles. However, the transmittance of the encapsulating layer 500 is greater than the transmittance of the light absorbing layer 400.

In some embodiments, a vertical distance between a top surface 500T of the encapsulating layer 500 and the top surfaces 200T of the light emitting diodes 200a, 200b, and 200c is H4. A vertical distance between the side surface of the light emitting diode 200c closest to the side surface 100S of the circuit substrate 100 and the side surface 500S of the encapsulating layer 500 is H5. The vertical distance H4 is less than the vertical distance H5.

In some embodiments, 0%≤H4/H5≤100%, wherein when the top surface 400T of the light absorbing layer 400 is higher than the top surfaces 200T of the light emitting diodes 200a, 200b, and 200c, and the light emitting diodes 200a, 200b, and 200c are water vapor resistant, the encapsulating layer 500 may be selectively not formed on the circuit substrate 100, and 0%=H4/H5 at this time. In a case where there is the encapsulating layer 500, if H4>H5, rays emitted by the light emitting diode 200c may be totally reflected on the surface of the encapsulating layer 500, which causes the issue of color shift. In some embodiments, the vertical distance H4 is 10 μm to 150 μm. In some embodiments, the vertical distance H5 is 50 μm to 500 μm.

Based on the above, by the configuration of the reflective layer 300, the brightness of the display panel 10 can be improved. In addition, the light absorbing layer 400 on the reflective layer 300 may be used to prevent external ambient light from being reflected by the reflective layer 300, thereby improving the display quality.

Figure 2G:
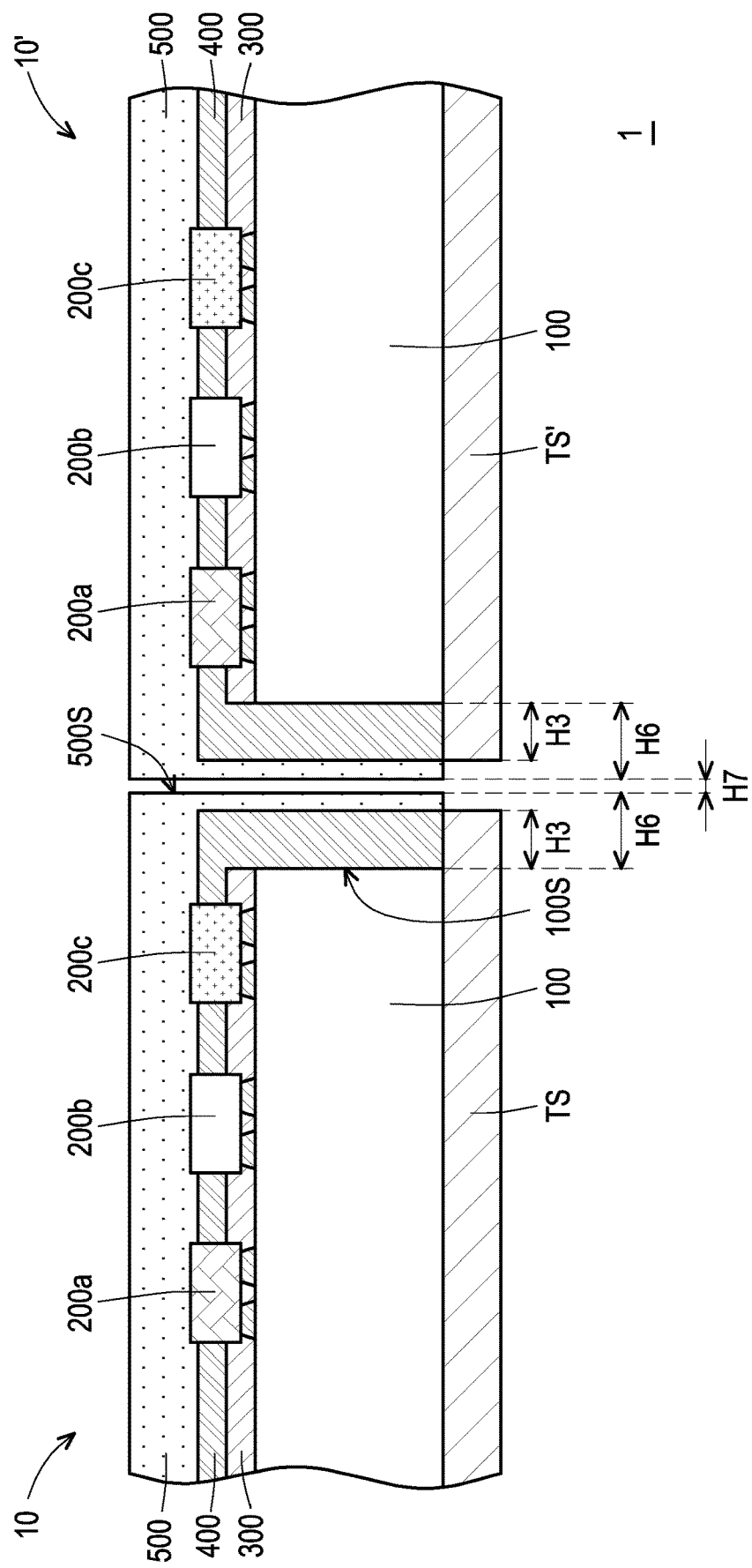
FIG. 2G is a cross-sectional schematic view of a display device according to an embodiment of the disclosure.

Please refer to FIG. 2G. The display panel 10 is fixed on a connector TS to be bonded to a connector TS' and a display panel 10' to form a spliced display device 1. In the embodiment, the display panel 10' has the same structure as the display panel 10. The display panel 10 will be exemplified below for description.

In some embodiments, a vertical distance between the side surface 500S of the display panel 10 (in the embodiment, the side surface 500S of the display panel 10 is the side surface 500S of the encapsulating layer 500) and the side surface 100S of the circuit substrate 100 is H6. In some embodiments, 50%≤H3/H6≤100%. In the embodiment where the encapsulating layer 500 is not formed on the side surface 100S of the circuit substrate 100, the side surface 500S of the display panel 10 is the side surface 400S of the light absorbing layer 400. In other words, in a preferred embodiment, the encapsulating layer 500 does not cover the side surface 100S of the circuit substrate 100, and H3=H6 in this case. In some embodiments, an encapsulating material is cropped to form the encapsulating layer 500. If the cropping position is located on the light absorbing layer 400, the cropped encapsulating layer 500 exposes the light absorbing layer 400, and H3=H6 at this time. In some embodiments, the vertical distance H6 is 20 μm to 100 μm. Since 50%≤H3/H6≤100%, a gap between the display panel 10' and the display panel 10 may not easily transmit light, so that the gap between the display panel 10' and the display panel 10 may not be easily seen, thereby obtaining the advantage of seamless splicing.

In some embodiments, a distance between the display panel 10' and the display panel 10 is H7. In some embodiments, 25 μm≤H6+H7/2≤100 μm. In a preferred implementation, 25 μm≤H6+H7/2≤50 μm, so that the gap between the display panel 10' and the display panel 10 is not easily seen, and a side wall of the circuit substrate 100 of the display panel 10' and a side wall of the circuit substrate 100 of the display panel 10 can be prevented from colliding with each other. In some embodiments, a distance H7 between the display panel 10' and the display panel 10 is 10 μm to 90 μm.

Based on the above, the spliced display device 1 has the advantage of seamless splicing.

Figure 3A:
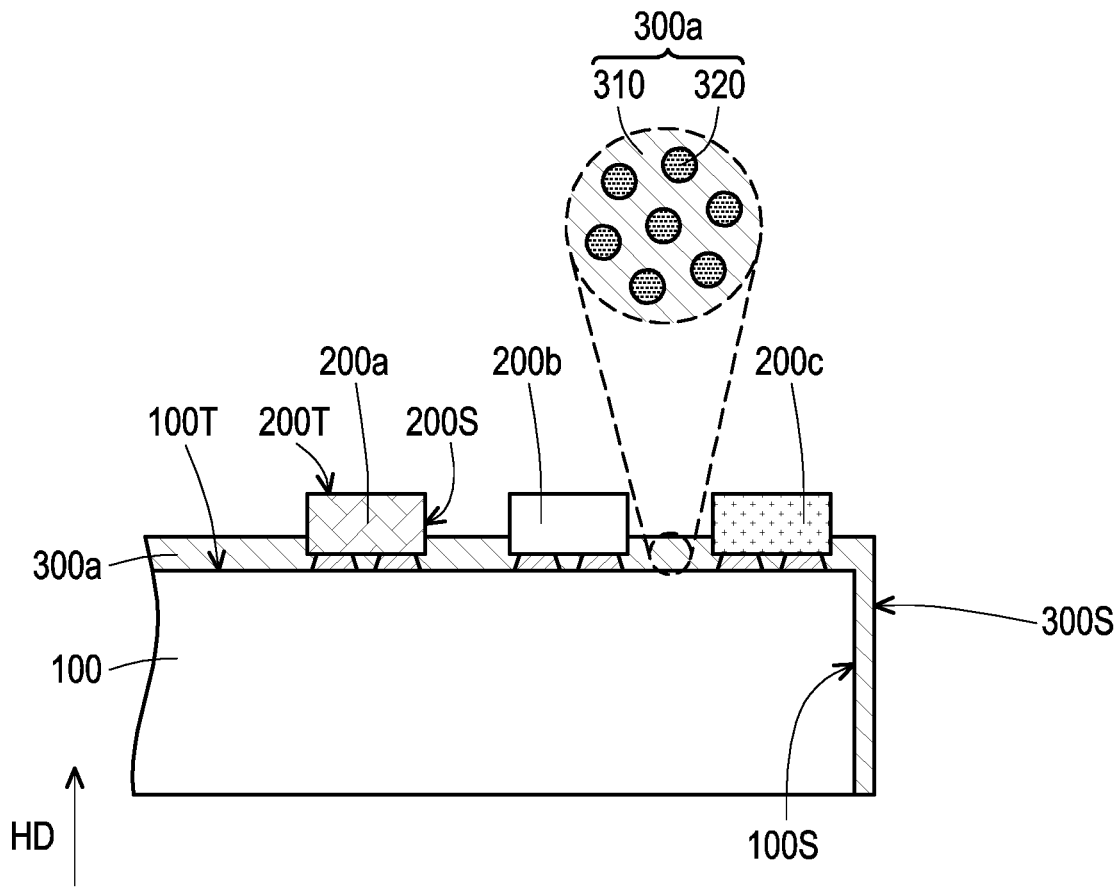
FIG. 3A to FIG. 3C are cross-sectional schematic views of a manufacturing method of a display panel according to an embodiment of the disclosure.
Figure 3B:
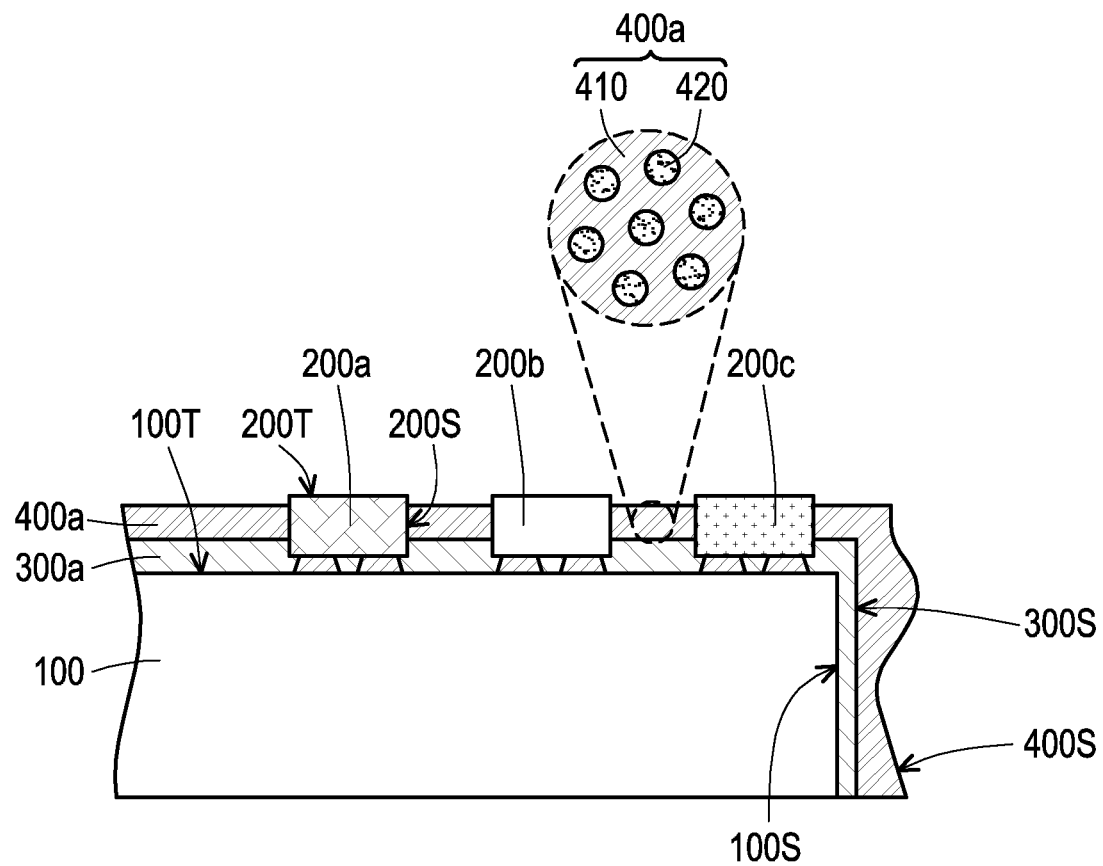
Figure 3C:
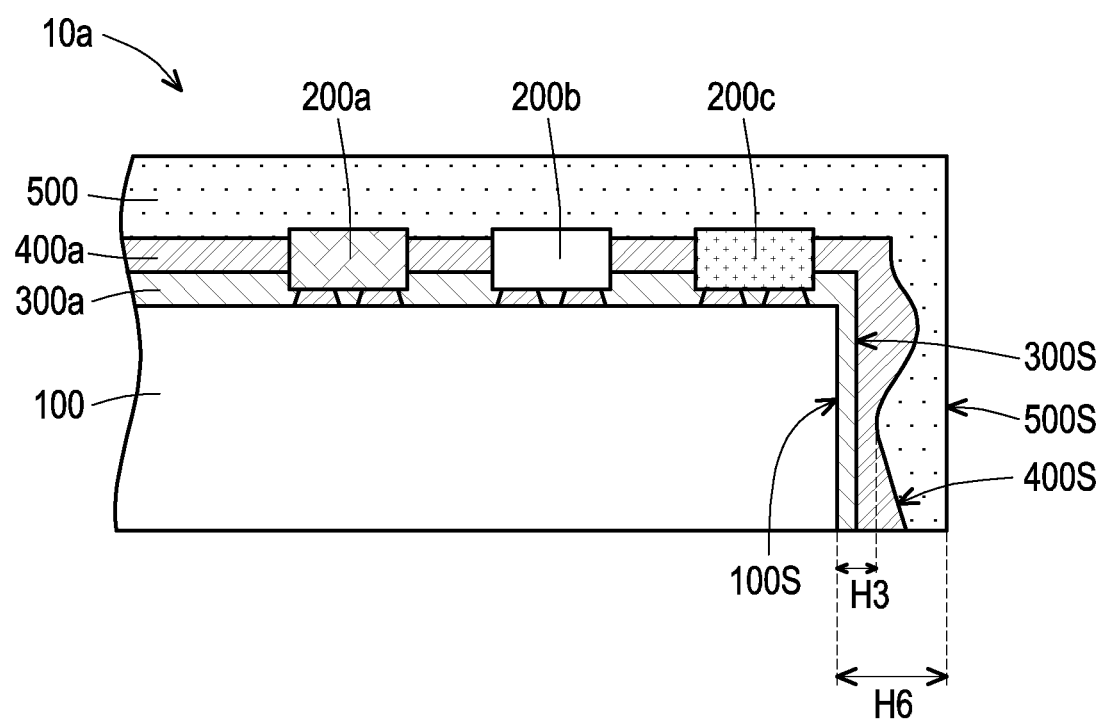

FIG. 3A to FIG. 3C are cross-sectional schematic views of a manufacturing method of a display panel according to an embodiment of the disclosure. It must be noted here that the embodiment of FIG. 3A to FIG. 3C continues to use the reference numerals and some content of the embodiment of FIG. 2A to FIG. 2F, wherein the same or similar reference numerals are adopted to denote the same or similar elements, and the description of the same technical content is omitted. For the description of the omitted parts, reference may be made to the foregoing embodiment, which will not be repeated here.

Please refer to FIG. 3A. After placing the light emitting diodes 200a, 200b, and 200c on the circuit substrate 100, a reflective layer 300a is formed on the circuit substrate 100. The method for forming the reflective layer 300a includes inkjet printing. The reflective layer 300a includes the first base material 310 and the reflective microstructures 320 dispersed in the first base material 310.

In the embodiment, the reflective layer 300a is formed on the top surface 100T and the side surface 100S of the circuit substrate 100. The reflective layer 300a covers the top surface 100T of the circuit substrate 100. In the embodiment, the reflective layer 300a selectively covers the side surface 100S of the circuit substrate 100. In some embodiments, the reflective layer 300a formed by inkjet printing flows to the side surface 100S of the circuit substrate 100, so that a side surface 300S of the reflective layer 300a covers the side surface 100S of the circuit substrate 100. Compared with the reflective layer 300 formed by the molding process of FIG. 2B, the side surface 300S of the reflective layer 300a formed by inkjet printing may be an uneven surface and is not limited to a flat surface shown in FIG. 3A.

The reflective layer 300a exposes the top surfaces 200T of the light emitting diodes 200a, 200b, and 200c. The reflective layer 300a is in contact with a part of the side surfaces 200S of the light emitting diodes 200a, 200b, and 200c, and a part of the reflective layer 300a is located between the light emitting diodes 200a, 200b, and 200c and the circuit substrate 100, wherein taking the direction HD perpendicular to the top surface 100T of the circuit substrate 100 as the height direction, a horizontal height of a top surface of the reflective layer 300a is located between the horizontal height of the top surface of the light emitting layer of the light emitting diodes 200a, 200b, and 200c and the horizontal height of the top surfaces 200T of the light emitting diodes 200a, 200b, and 200c.

Please refer to FIG. 3B. A light absorbing layer 400a is formed on the reflective layer 300. The method for forming the light absorbing layer 400a includes inkjet printing. The light absorbing layer 400a includes the second base material 410 and the light absorbing particles 420 dispersed in the second base material 410.

The light absorbing layer 400a covers the top surface 100T of the circuit substrate 100 and the side surface 100S of the circuit substrate 100. In some embodiments, the light absorbing layer 400a formed by inkjet printing flows to the side surface 100S of the circuit substrate 100 (or the side surface 300S of the reflective layer 300a), so that the side surface 400S of the light absorbing layer 400a covers the side surface 100S of the circuit substrate 100 (or the side surface 300S of the reflective layer 300a). Compared with the light absorbing layer 400 formed by the molding process of FIG. 2D, the side surface 400S of the light absorbing layer 400a formed by inkjet printing is, for example, an uneven surface.

Please refer to FIG. 3C. The encapsulating layer 500 is selectively formed on the light absorbing layer 400a. At this point, a display device 10a is roughly completed.

In the embodiment, the shortest vertical distance between the side surface 400S of the light absorbing layer 400 and the side surface 100S of the circuit substrate 100 is H3. The vertical distance between the side surface 500S of the display panel 10a (in the embodiment, the side surface 500S of the display panel 10a is the side surface 500S of the encapsulating layer 500) and the side surface 100S of the circuit substrate 100 is H6. In some embodiments, 50%≤H3/H6≤100%. In the embodiment, the encapsulating layer 500 and/or the light absorbing layer 400 completely cover the side surface 300S of the reflective layer 300a, so that the side surface 300S of the reflective layer 300a is not exposed.

Figure 4:
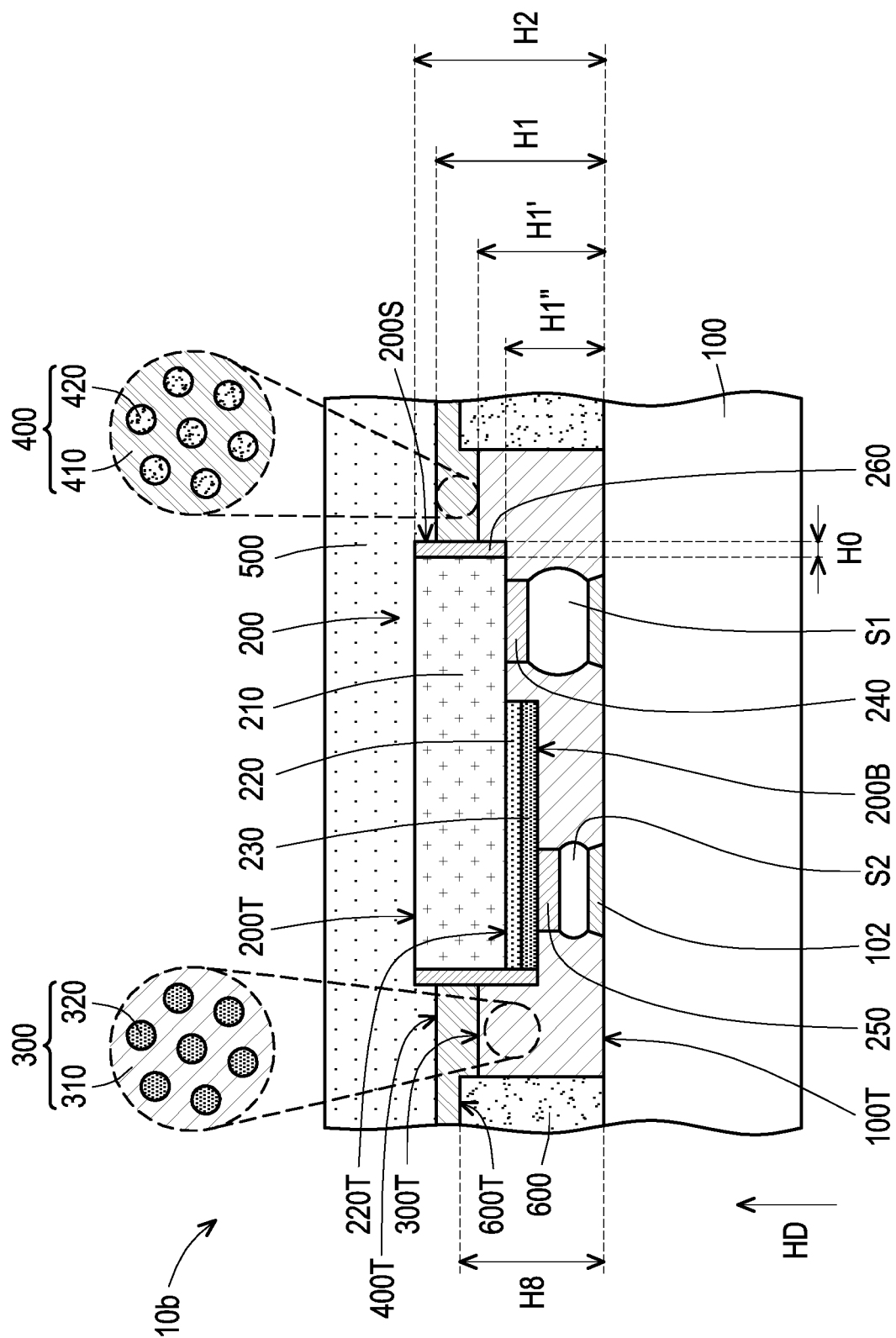
FIG. 4 is a cross-sectional schematic view of a display panel according to an embodiment of the disclosure.

FIG. 4 is a cross-sectional schematic view of a display panel according to an embodiment of the disclosure. It must be noted here that the embodiment of FIG. 4 continues to use the reference numerals and some content of the embodiment of FIG. 1, wherein the same or similar reference numerals are adopted to denote the same or similar elements, and the description of the same technical content is omitted. For the description of the omitted parts, reference may be made to the foregoing embodiment, which will not be repeated here.

The main difference between a display panel 10b of FIG. 4 and the display panel 10 of FIG. 1 is that the display panel 10b further includes a black barrier structure 600. In some embodiments, the transmittance of the black barrier structure 600 to visible light is less than 50%, and the reflectivity is less than 20%. In some embodiments, the material of the black barrier structure 600 is the same as or different from the material of the light absorbing layer 400.

Please refer to FIG. 4. The black barrier structure 600 surrounds the reflective layer 300. The black barrier structure 600 and the light emitting diode 200 are separated by the reflective layer 300. The black barrier structure 600 is adapted to shield a reflective material (for example, a metal signal line) in the circuit substrate 100, thereby preventing the reflective material in the circuit substrate 100 from affecting the display image.

The vertical distance between the top surface 400T of the light absorbing layer 400 and the top surface 100T of the circuit substrate 100 is H1. A vertical distance between a top surface 600T of the black barrier structure 600 and the top surface 100T of the circuit substrate 100 is H8. The vertical distance H1 is greater than or equal to the vertical distance H8. In the embodiment, the vertical distance H1 is greater than the vertical distance H8.

The vertical distance between the top surface 220T of the light emitting layer 220 and the top surface 100T of the circuit substrate 100 is H1". In some embodiments, the difference between the vertical distance H1 and the vertical distance H1" is only 3 μm to 5 μm. Therefore, the film thickness of the light absorbing layer 400 is not easy to control. The black barrier structure 600 is formed on a part where the light emitting diode 200 does not need to be disposed, which may prevent the issue of the light absorbing layer 400 being penetrated and exposing the reflective layer 300 underneath due to process errors of the light absorbing layer 400. In other words, by the configuration of the black barrier structure 600, on the part where the light emitting diode 200 is not disposed, the reflective layer 300 will not be exposed even if the light absorbing layer 400 is penetrated.

In the embodiment, the light absorbing layer 400 covers the top surface 300T of the reflective layer 300 around the light emitting diode 200 and crosses over an interface between the reflective layer 300 and the black barrier structure 600 closest to the light emitting diode 200.

Taking the direction HD perpendicular to the top surface 100T of the circuit substrate 100 as the height direction, the horizontal height of the top surface 300T of the reflective layer 300 is located between the horizontal height of the top surface 220T of the light emitting layer 220 and the horizontal height of the top surface 200T of the light emitting diode 200 (that is, the top surface of the first semiconductor layer 210 in the embodiment). Based on this, the reflective layer 300 may effectively reflect rays emitted by the light emitting layer 220, thereby improving the luminous efficiency of the light emitting diode 200.

FIG. 5A to FIG. 5E are cross-sectional schematic views of a manufacturing method of a display panel according to an embodiment of the disclosure. It must be noted here that the embodiment of FIG. 5A to FIG. 5E continues to use the reference numerals and some content of the embodiment of FIG. 2A to FIG. 2F, wherein the same or similar reference numerals are adopted to denote the same or similar elements, and the description of the same technical content is omitted. For the description of the omitted parts, reference may be made to the foregoing embodiment, which will not be repeated here.

Figure 5A:
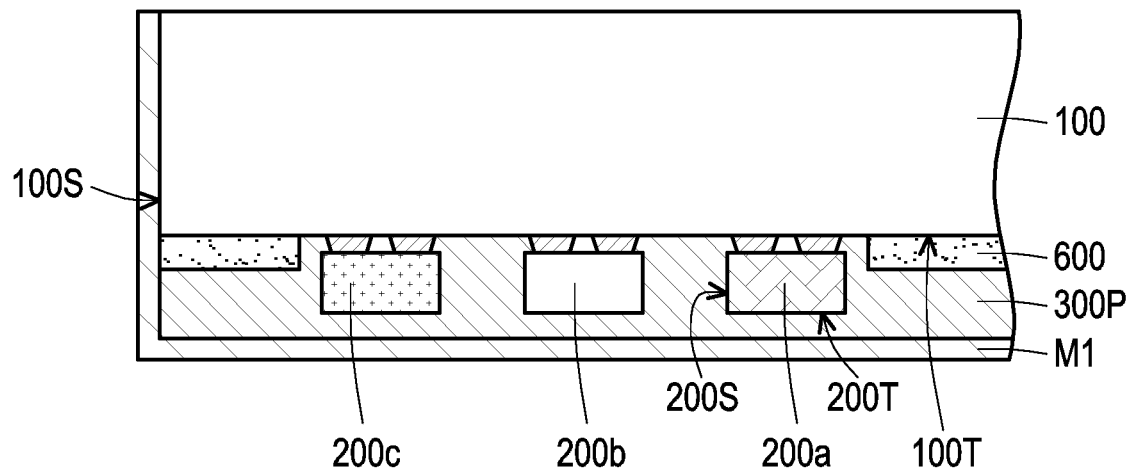
FIG. 5A to FIG. 5E are cross-sectional schematic views of a manufacturing method of a display panel according to an embodiment of the disclosure.
Figure 5B:
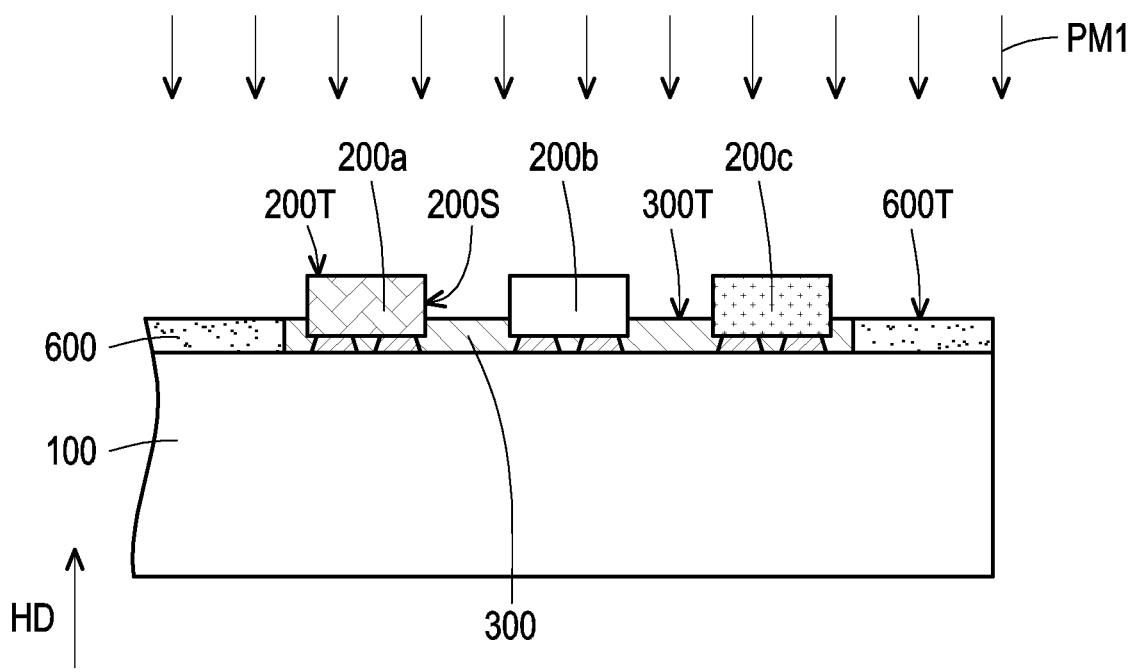

Please refer to FIG. 5A and FIG. 5B. In some embodiments, before placing the light emitting diodes 200a, 200b, and 200c on the circuit substrate 100, the black barrier structure 600 is formed on the circuit substrate 100. For example, the black barrier structure 600 is formed by a photolithography process, and the black barrier structure 600 includes, for example, a cured photoresist. In other embodiments, after placing the light emitting diodes 200a, 200b, and 200c on the circuit substrate 100, the black barrier structure 600 is formed by inkjet printing or mold forming and a plasma etching process.

Please refer to FIG. 5A first. After placing the light emitting diodes 200a, 200b, and 200c on the circuit substrate 100, the light emitting diodes 200a, 200b, and 200c, the black barrier structure 600, and the circuit substrate 100 are placed in the first mold M1. The reflective material 300P is filled in the first mold M1. The reflective material 300P is coated around the light emitting diodes 200a, 200b, and 200c. For example, the reflective material 300P is coated around the top surfaces 200T and the side surfaces 200S of the light emitting diodes 200a, 200b, and 200c. In some embodiments, the reflective material 300P is also coated around the top surface 600T and a side surface 600S of the black barrier structure 600.

Next, the reflective material 300P is cured.

Please refer to FIG. 5B. After curing the reflective material 300P, the first mold M1 is removed. In the embodiment, after removing the first mold M1, the cured reflective material 300P covers the top surfaces of the light emitting diodes 200a, 200b, and 200c. The etching process PM1 is executed on the cured reflective material 300P to form the reflective layer 300 exposing the top surfaces 200T of the light emitting diodes 200a, 200b, and 200c. In some embodiments, the etching process PM1 includes, for example, a plasma etching process. In the embodiment, the reflective layer 300 also exposes a part of the side surfaces 200S of the light emitting diodes 200a, 200b, and 200c. In some embodiments, the reflective layer 300 selectively exposes the top surface 600T of the black barrier structure 600. In some embodiments, the top surface 300T of the reflective layer 300 is equal to or lower than the top surface 600T of the black barrier structure 600. In the embodiment, the top surface 300T of the reflective layer 300 is equal to the top surface 600T of the black barrier structure 600, and the black barrier structure 600 surrounds the reflective layer 300.

In the embodiment, taking the direction HD perpendicular to the top surface 100T of the circuit substrate 100 as the height direction, the horizontal height of the top surface 300T of the reflective layer 300 is located between the horizontal height of the top surface of the light emitting layer of the light emitting diodes 200a, 200b, and 200c and the horizontal height of the top surfaces 200T of the light emitting diodes 200a, 200b, and 200c, wherein the reflective layer 300 is in contact with a part of the side surfaces of the light emitting diodes 200a, 200b, and 200c, and a part of the reflective layer 300 is located between the light emitting diodes 200a, 200b, and 200c and the circuit substrate 100.

Figure 5C:
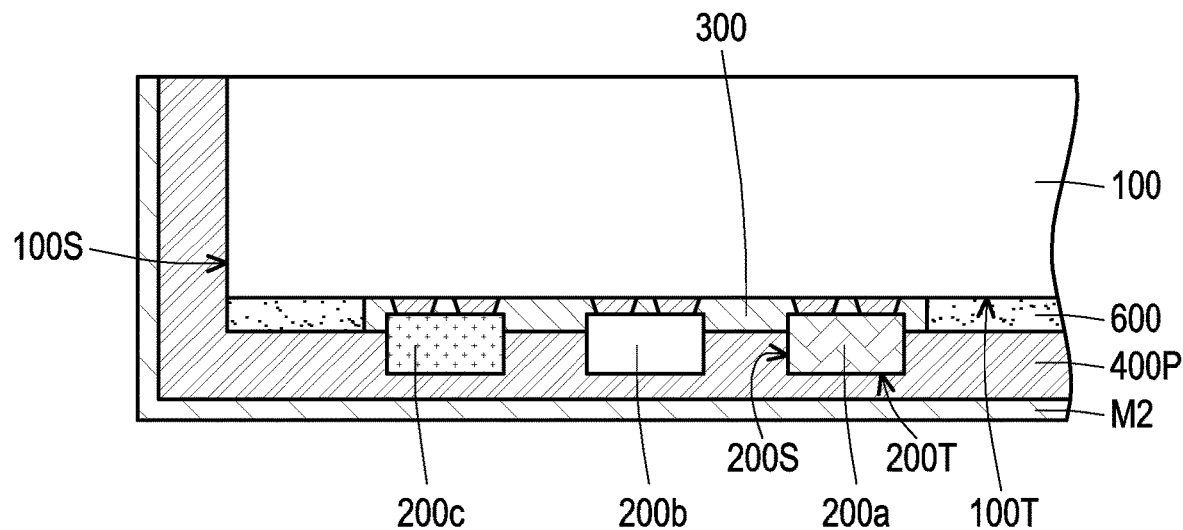
Figure 5D:
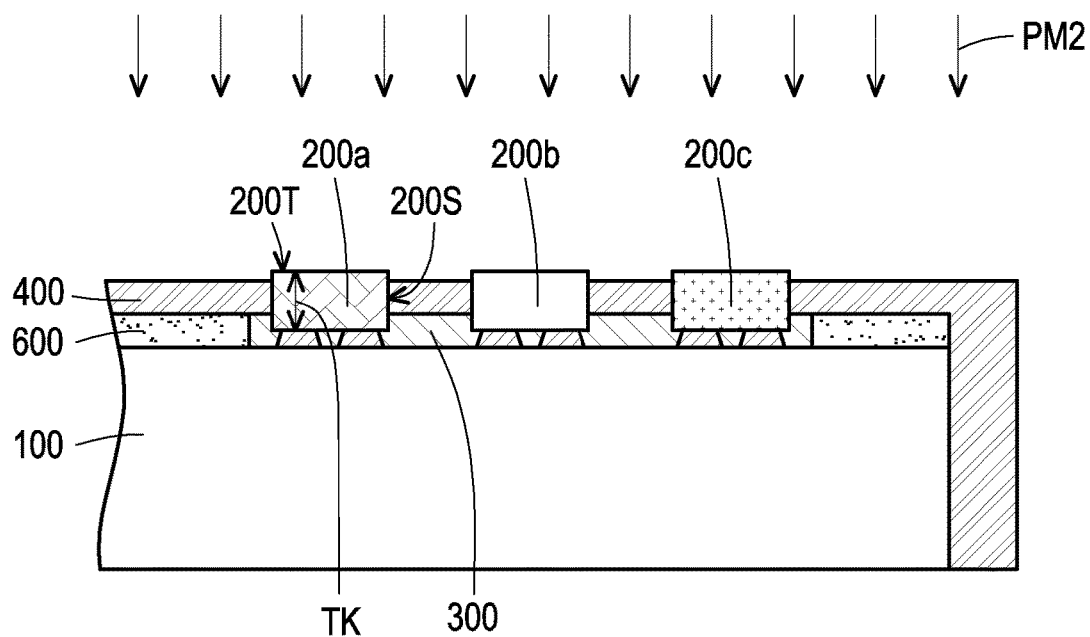

Please refer to FIG. 5C and FIG. 5D. The light absorbing layer 400 is formed on the reflective layer 300.

Please refer to FIG. 5C first. The light emitting diodes 200a, 200b, and 200c, the black barrier structure 600, the reflective layer 300, and the circuit substrate 100 are placed in the second mold M2. The light absorbing material 400P is filled in the second mold M2. The light absorbing material 400P is coated around the light emitting diodes 200a, 200b, and 200c. For example, the light absorbing material 400P is coated around the top surfaces 200T and the side surfaces 200S of the light emitting diodes 200a, 200b, and 200c. In some embodiments, the light absorbing material 400P is in contact with the top surface 600T of the black barrier structure 600, but the disclosure is not limited thereto.

Next, the light absorbing material 400P is cured.

Please refer to FIG. 5D. After curing the light absorbing material 400P, the second mold M2 is removed. In the embodiment, after removing the second mold M2, the cured light absorbing material 400P covers the top surfaces 200T of the light emitting diodes 200a, 200b, and 200c. The etching process PM2 is executed on the cured reflective material 400P to form the light absorbing layer 400 exposing the top surfaces 200T of the light emitting diodes 200a, 200b, and 200c. In some embodiments, the etching process PM2 includes, for example, a plasma etching process. In the embodiment, the light absorbing layer 400 also exposes a part of the side surfaces 200S of the light emitting diodes 200a, 200b, and 200c. In other embodiments, the light absorbing layer 400 also exposes the top surface 600T of the black barrier structure 600.

Figure 5E:
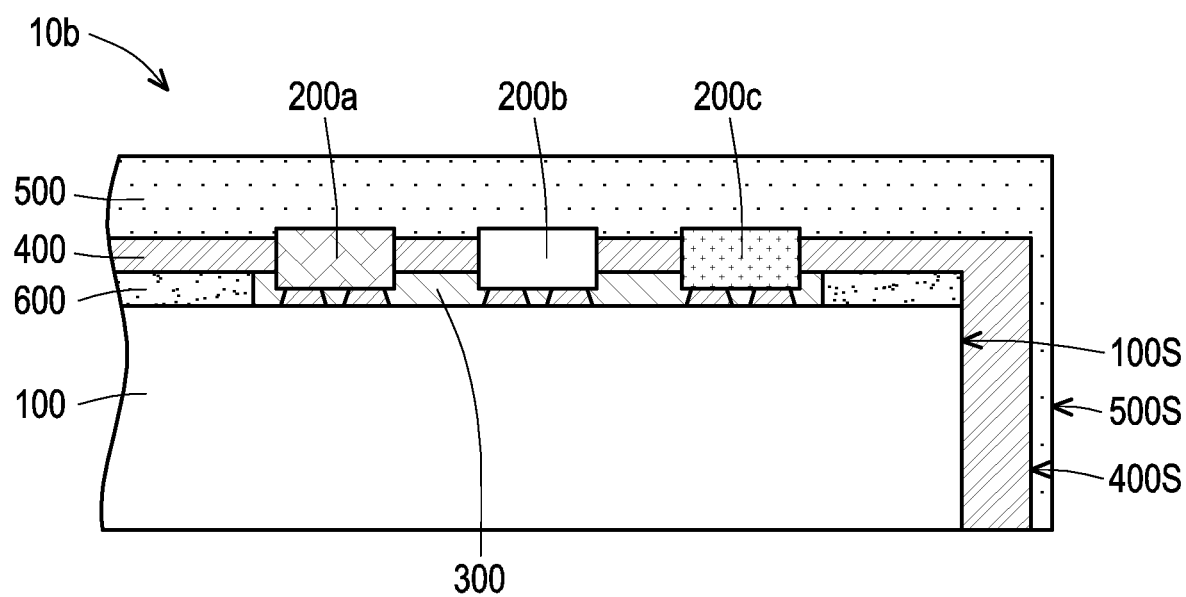

Please refer to FIG. 5E. The encapsulating layer 500 is formed on the light absorbing layer 400. So far, the display panel 10b is roughly completed.

Figure 6:
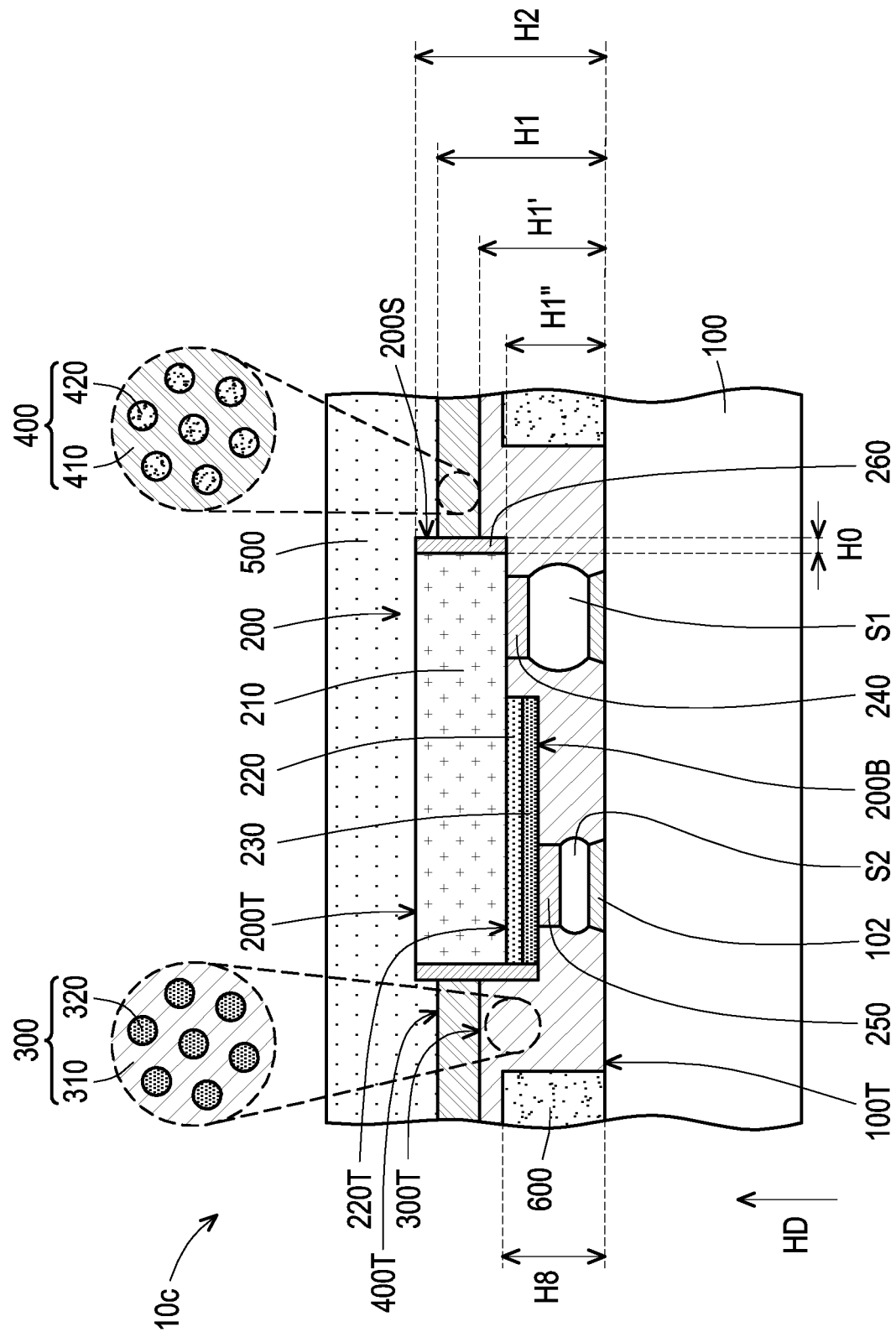
FIG. 6 is a cross-sectional schematic view of a display panel according to an embodiment of the disclosure.

FIG. 6 is a cross-sectional schematic view of a display panel according to an embodiment of the disclosure. It must be noted here that the embodiment of FIG. 6 continues to use the reference numerals and some content of the embodiment of FIG. 4, wherein the same or similar reference numerals are adopted to denote the same or similar elements, and the description of the same technical content is omitted. For the description of the omitted parts, reference may be made to the foregoing embodiment, which will not be repeated here.

The main difference between a display panel 10c of FIG. 6 and the display panel 10b of FIG. 4 is that a part of the reflective layer 300 of the display panel 10c covers the top surface 600T of the black barrier structure 600.

Please refer to FIG. 6. The light absorbing layer 400 is disposed on the reflective layer 300. Even if a part of the reflective layer 300 covers the top surface 600T of the black barrier structure 600, the light absorbing layer 400 can still block external ambient light from being reflected by the reflective layer 300.

Figure 7A:
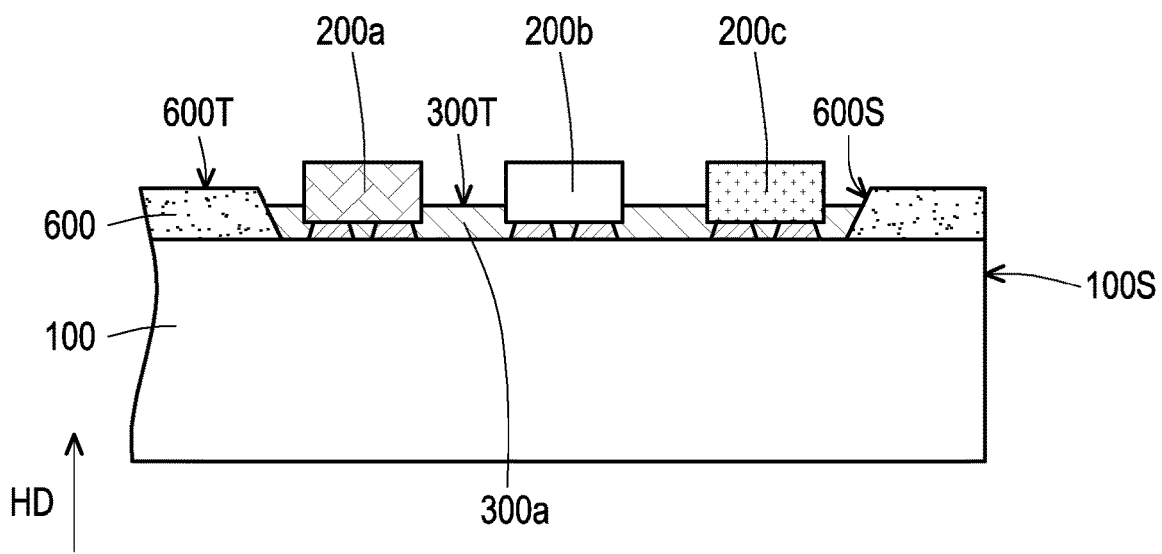
FIG. 7A and FIG. 7B are cross-sectional schematic views of a manufacturing method of a display panel according to an embodiment of the disclosure.
Figure 7B:
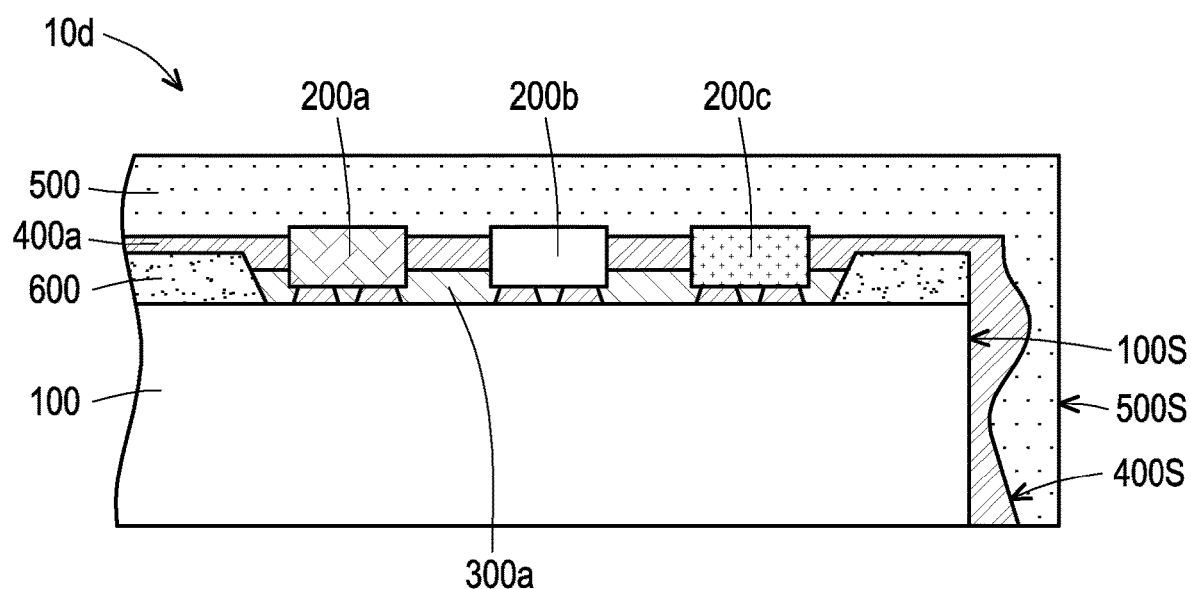

FIG. 7A and FIG. 7B are cross-sectional schematic views of a manufacturing method of a display panel according to an embodiment of the disclosure. It must be noted here that the embodiment of FIG. 7A and FIG. 7B continues to use the reference numerals and some content of the embodiment of FIG. 5A to FIG. 5E, wherein the same or similar reference numerals are adopted to denote the same or similar elements, and the description of the same technical content is omitted. For the description of the omitted parts, reference may be made to the foregoing embodiment, which will not be repeated here.

Please refer to FIG. 7A. The reflective layer 300a is formed on the circuit substrate 100. In the embodiment, the reflective layer 300a is formed on the circuit substrate 100 by inkjet printing. In some embodiments, the side surface 600S of the black barrier structure 600 facing the light emitting diode 200 is, for example, an inclined surface, thereby helping to form the reflective layer 300a within a region surrounded by the black barrier structure 600. In the embodiment, the top surface 300T of the reflective layer 300a is lower than the top surface 600T of the black barrier structure 600.

In the embodiment, taking the direction HD perpendicular to the top surface 100T of the circuit substrate 100 as the height direction, the horizontal height of the top surface 300T of the reflective layer 300 is located between the horizontal height of the top surface of the light emitting layer of the light emitting diodes 200a, 200b, and 200c and the horizontal height of the top surfaces 200T of the light emitting diodes 200a, 200b, and 200c, wherein the reflective layer 300 is in contact with a part of the side surfaces of the light emitting diodes 200a, 200b, and 200c, and a part of the reflective layer 300 is located between the light emitting diodes 200a, 200b, and 200c and the circuit substrate 100.

Please refer to FIG. 7B. The light absorbing layer 400a is formed on the reflective layer 300a. In the embodiment, the light absorbing layer 400a is formed on the reflective layer 300a by inkjet printing. Next, the encapsulating layer 500 is formed on the light absorbing layer 400a. At this point, a display panel 10d is roughly completed.

Figure 8A:
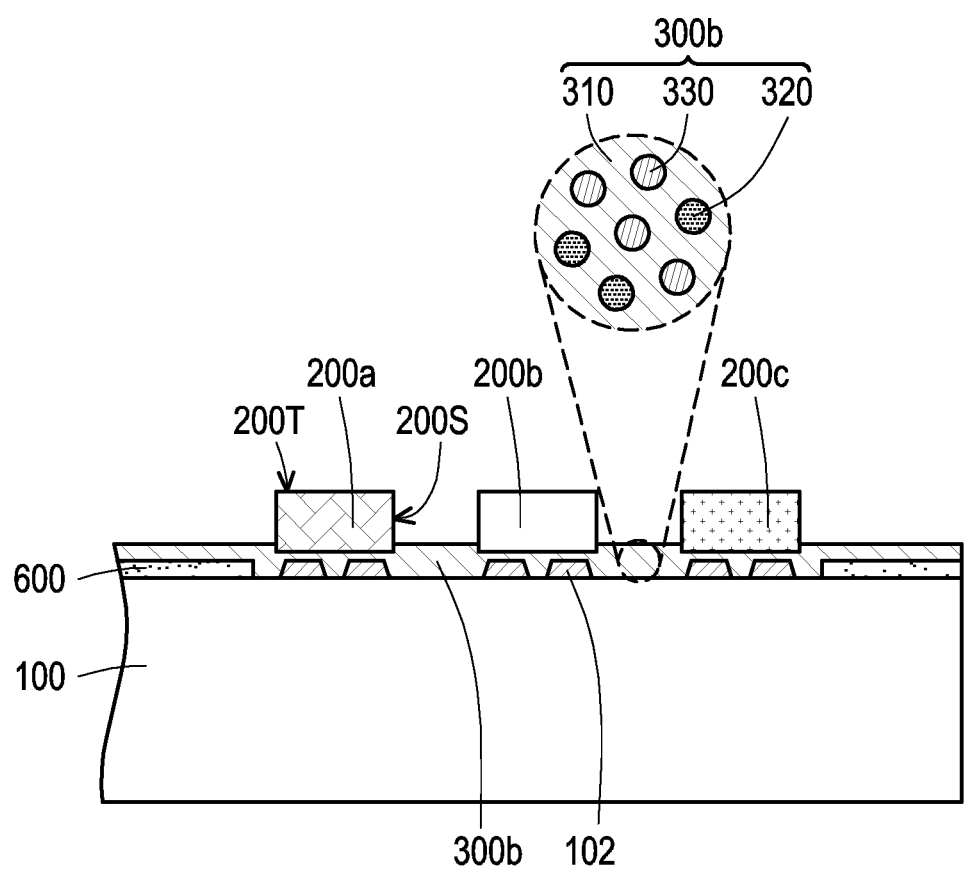
FIG. 8A to FIG. 8C are cross-sectional schematic views of a manufacturing method of a display panel according to an embodiment of the disclosure.
Figure 8B:
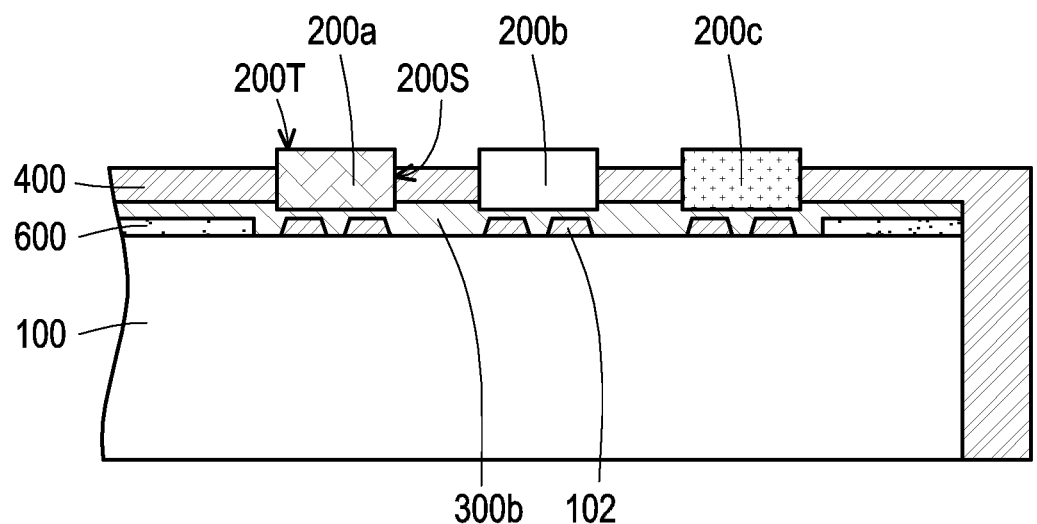
Figure 8C:
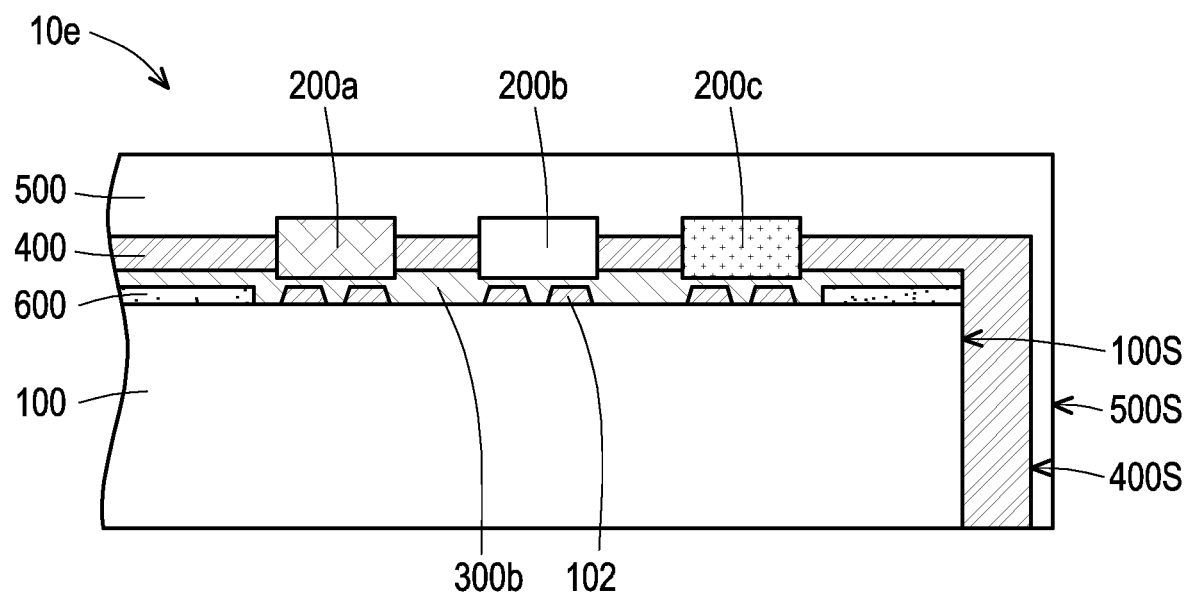

FIG. 8A to FIG. 8C are cross-sectional schematic views of a manufacturing method of a display panel according to an embodiment of the disclosure. It must be noted here that the embodiment of FIG. 8A to FIG. 8D continues to use the reference numerals and some content of the embodiment of FIG. 5A to FIG. 5E, wherein the same or similar reference numerals are adopted to denote the same or similar elements, and the description of the same technical content is omitted. For the description of the omitted parts, reference may be made to the foregoing embodiment, which will not be repeated here.

Please refer to FIG. 8A. Before placing the light emitting diodes 200a, 200b, and 200c on the circuit substrate 100, a reflective layer 300b is formed on the circuit substrate 100. The reflective layer 300b includes an anisotropic conductive film. For example, the reflective layer 300b not only includes the first base material 310 and the reflective microstructures 320 dispersed in the first base material, but also includes multiple conductive particles 330 dispersed in the first base material.

In the embodiment, in addition to being formed on the pads 102 of the circuit substrate 100, the reflective layer 300b is also formed on the black barrier structure 600, but the disclosure is not limited thereto. In some embodiments, the reflective layer 300b is patterned without overlapping with the black barrier structure 600.

After forming the reflective layer 300b, the light emitting diodes 200a, 200b, and 200c are placed on the circuit substrate 100, so that the light emitting diodes 200a, 200b, and 200c are electrically connected to the pads 102 of the circuit substrate 100 through the reflective layer 300b.

Please refer to FIG. 8B. The light absorbing layer 400 is formed on the reflective layer 300b. In the embodiment, the light absorbing layer 400 (for example, the processes of FIG. 5C and FIG. 5D) is formed by mold forming and a plasma etching process, but the disclosure is not limited thereto. In other embodiments, the light absorbing layer 400 is formed on the reflective layer 300b by inkjet printing.

Please refer to FIG. 8C. The encapsulating layer 500 is formed on the light absorbing layer 400. At this point, a display panel 10e is roughly completed.

Figure 9A:
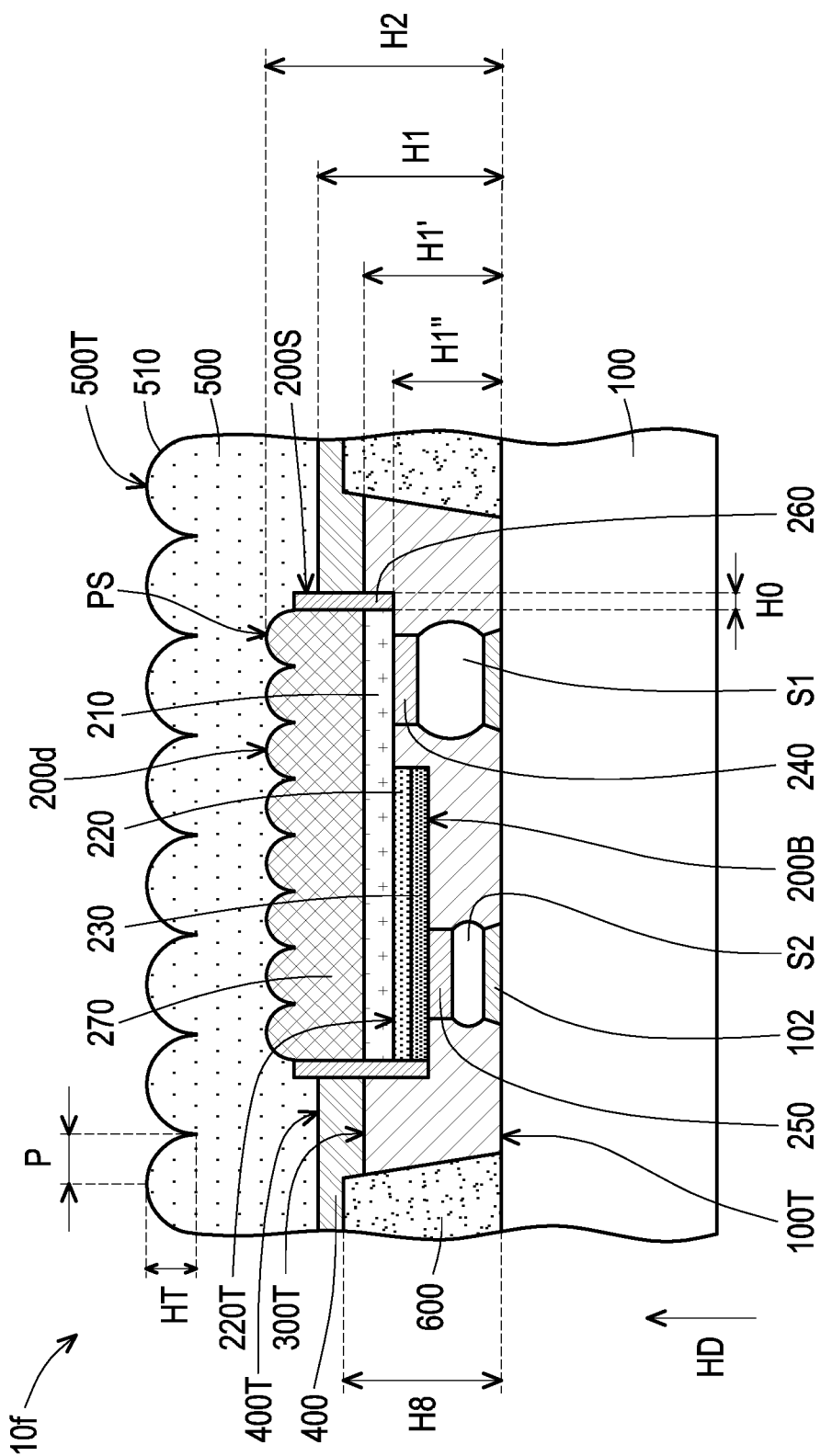
FIG. 9A is a cross-sectional schematic view of a display panel according to an embodiment of the disclosure.
Figure 9B:
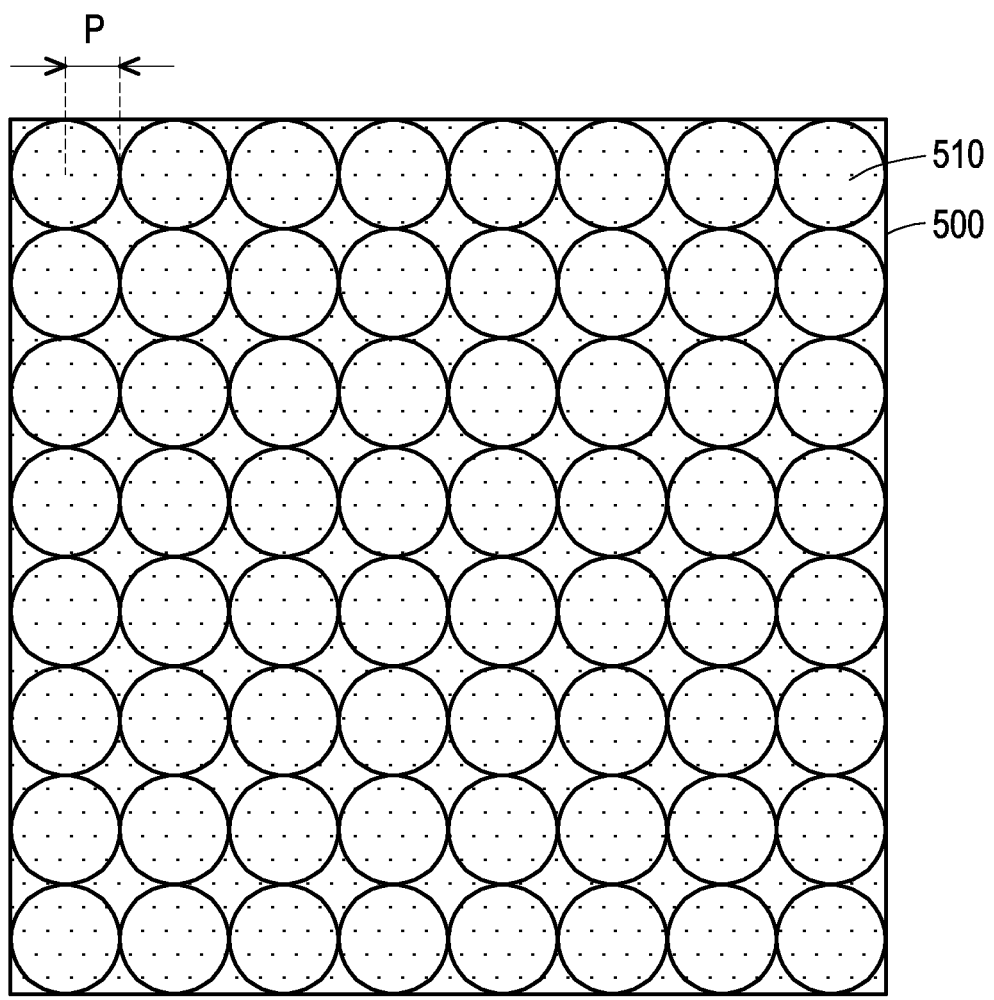
FIG. 9B is a top schematic view of the display panel of FIG. 9A.

FIG. 9A is a cross-sectional schematic view of a display panel according to an embodiment of the disclosure. FIG. 9B is a top schematic view of the display panel of FIG. 9A. It must be noted here that the embodiment of FIG. 9A and FIG. 9B continues to use the reference numerals and some content of the embodiment of FIG. 7A and FIG. 7B, wherein the same or similar reference numerals are adopted to denote the same or similar elements, and the description of the same technical content is omitted. For the description of the omitted parts, reference may be made to the foregoing embodiment, which will not be repeated here.

Please refer to FIG. 9A and FIG. 9B. In the embodiment, in addition to the first semiconductor layer 210, the light emitting layer 220, the second semiconductor layer 230, the first electrode 240, the second electrode 250, and the insulating layer 260, a light emitting diode 200d also includes a patterned semiconductor substrate 270.

The patterned semiconductor substrate 270 is located on the other side of the first semiconductor layer 210 opposite to the light emitting layer 220. The patterned semiconductor substrate 270 has a patterned surface PS. The material of the patterned semiconductor substrate 270 includes, for example, GaN, InGaN, GaAs, AlGaInP, other materials composed of IIIA group and VA group elements, or other suitable materials, but the disclosure is not limited thereto. The conductivity of the patterned semiconductor substrate 270 is less than the conductivity of the first semiconductor layer 210.

The top surface 500T of the encapsulating layer 500 has multiple protruding microstructures 510. In the embodiment, from the top schematic view (FIG. 9B), the microstructure 510 is a circle with a radius P, and from the cross-sectional schematic view (FIG. 9A), the height of the microstructure 510 is HT. In some embodiments, HT/P is 1 to 1.25, thereby helping to increase the brightness of a display panel 10f.

Figure 10:
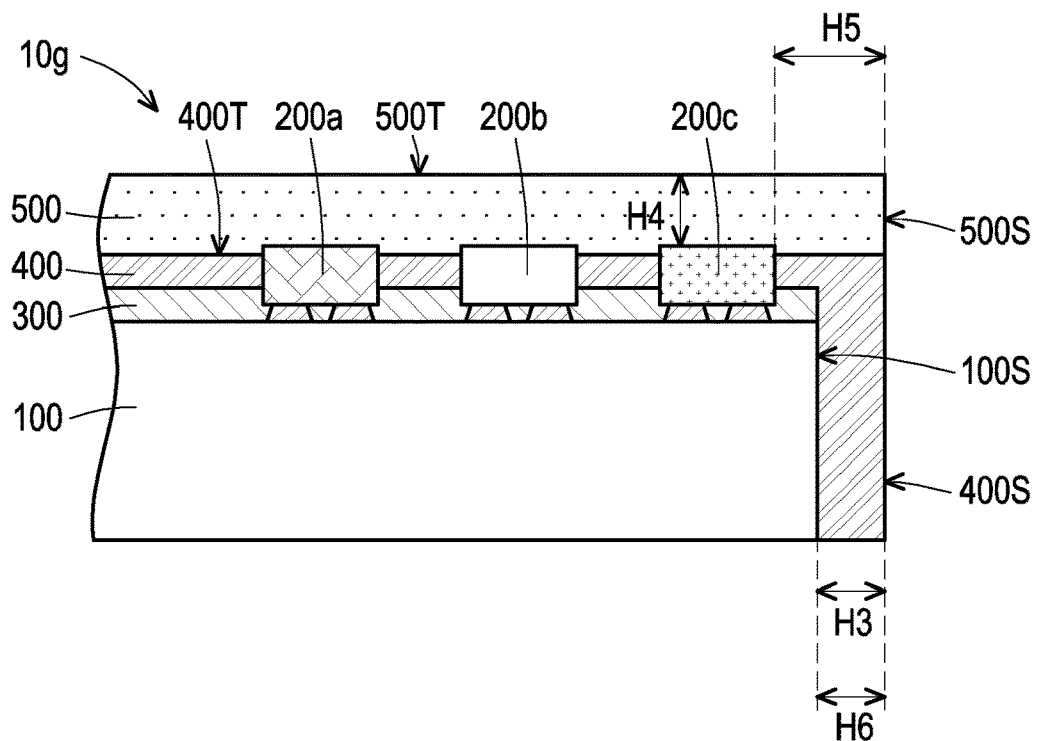
FIG. 10 is a cross-sectional schematic view of a display panel according to an embodiment of the disclosure.

FIG. 10 is a cross-sectional schematic view of a display panel according to an embodiment of the disclosure. It must be noted here that the embodiment of FIG. 10 continues to use the reference numerals and some content of the embodiment of FIG. 2F, wherein the same or similar reference numerals are adopted to denote the same or similar elements, and the description of the same technical content is omitted. For the description of the omitted parts, reference may be made to the foregoing embodiment, which will not be repeated here.

The difference between a display panel 10g of FIG. 10 and the display panel 10 of FIG. 2F is that the encapsulating layer 500 of the display panel 10g is not formed on the side surface 100S of the circuit substrate 100. Therefore, in the embodiment, H3=H6.

Figure 11:
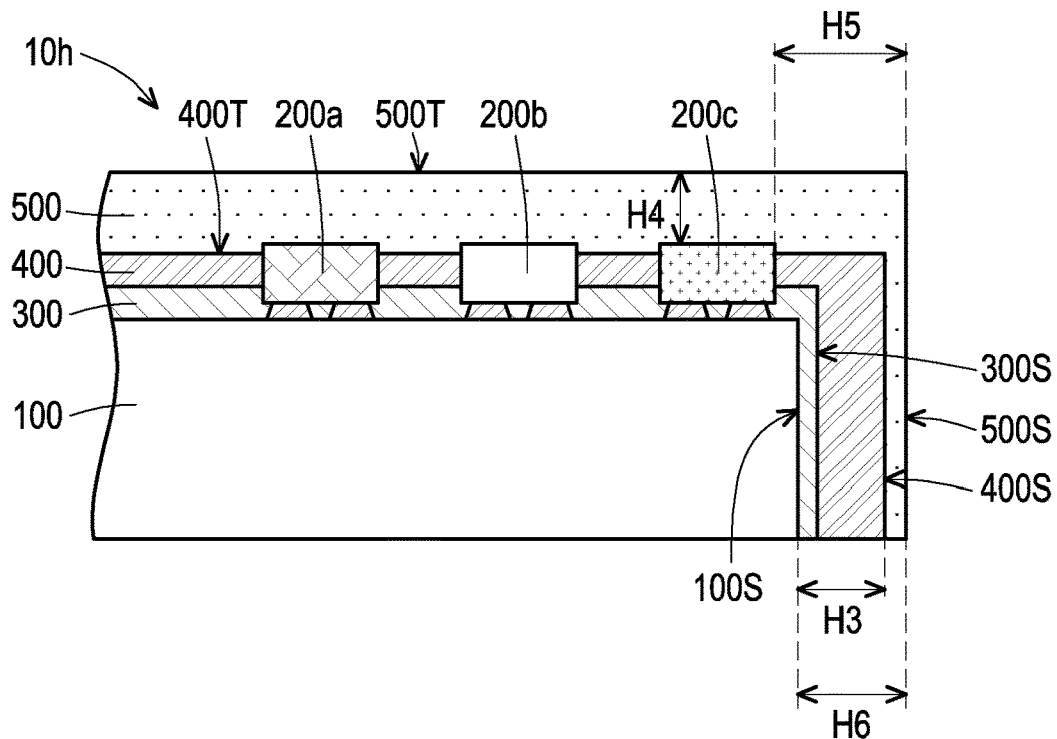
FIG. 11 is a cross-sectional schematic view of a display panel according to an embodiment of the disclosure.

FIG. 11 is a cross-sectional schematic view of a display panel according to an embodiment of the disclosure. It must be noted here that the embodiment of FIG. 11 continues to use the reference numerals and some content of the embodiment of FIG. 2F, wherein the same or similar reference numerals are adopted to denote the same or similar elements, and the description of the same technical content is omitted. For the description of the omitted parts, reference may be made to the foregoing embodiment, which will not be repeated here.

The difference between a display panel 10h of FIG. 11 and the display panel 10 of FIG. 2F is that the reflective layer 300 of the display panel 10h covers the side surface 100S of the circuit substrate 100.

Figure 12:
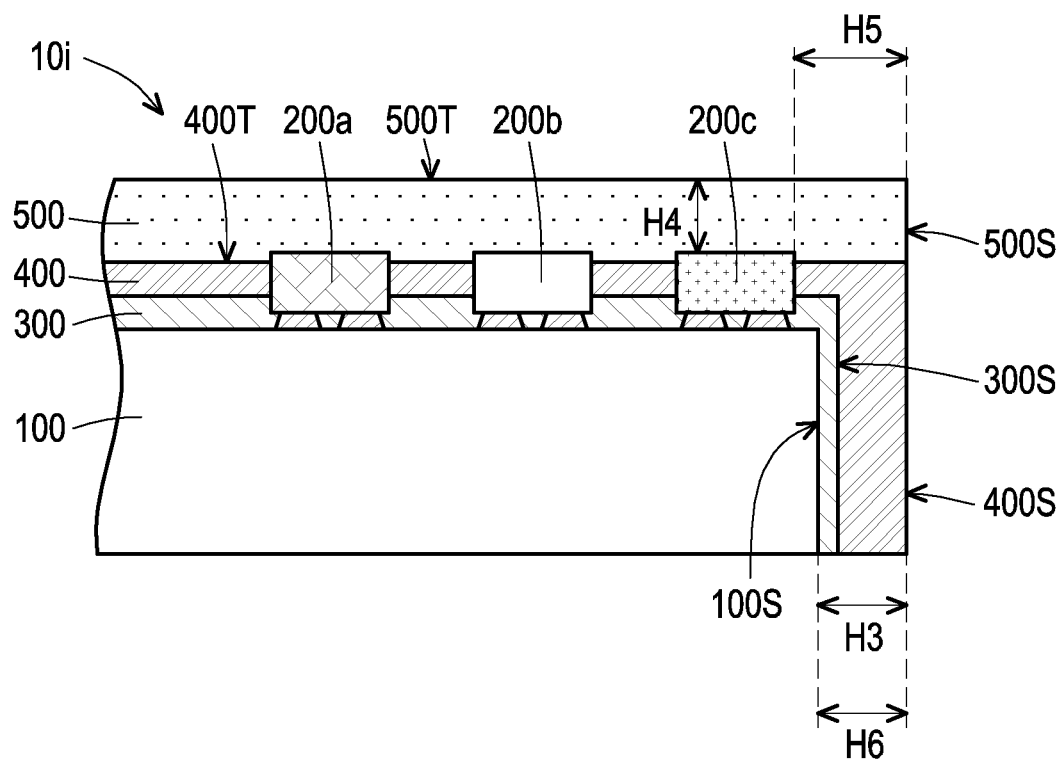
FIG. 12 is a cross-sectional schematic view of a display panel according to an embodiment of the disclosure.

FIG. 12 is a cross-sectional schematic view of a display panel according to an embodiment of the disclosure. It must be noted here that the embodiment of FIG. 12 continues to use the reference numerals and some content of the embodiment of FIG. 11, wherein the same or similar reference numerals are adopted to denote the same or similar elements, and the description of the same technical content is omitted. For the description of the omitted parts, reference may be made to the foregoing embodiment, which will not be repeated here.

The difference between a display panel 10i of FIG. 12 and the display panel 10h of FIG. 11 is that the encapsulating layer 500 of the display panel 10g is not formed on the side surface 100S of the circuit substrate 100. Therefore, in the embodiment, H3=H6.

What is claimed is:

1. A display panel, comprising:
   a circuit substrate;
   a light emitting diode, comprising:
      a first semiconductor layer, a light emitting layer, and a second semiconductor layer, wherein the light emitting layer is located between the first semiconductor layer and the second semiconductor layer, and the second semiconductor layer is located between the first semiconductor layer and the circuit substrate; and
      an insulating layer contacting a side wall of the first semiconductor layer, a side wall of the light emitting layer, and a side wall of the second semiconductor layer; and
   a reflective layer, in contact with a part of the light emitting diode, and a part of the reflective layer being located between the light emitting diode and the circuit substrate, wherein taking a direction perpendicular to a top surface of the circuit substrate as a height direction, a horizontal height of a top surface of the reflective layer is located between a horizontal height of a top surface of the light emitting layer and a horizontal height of a top surface of the light emitting diode, wherein the insulating layer is laterally disposed between the side wall of the second semiconductor layer and the reflective layer, and wherein the insulating layer is laterally disposed between the side wall of the light emitting layer and the reflective layer.

2. The display panel according to claim 1, further comprising:
   a light absorbing layer, located on the reflective layer, wherein the light absorbing layer and the reflective layer are in contact with a side surface of the light emitting diode; and
   an encapsulating layer, located on the light absorbing layer, wherein a transmittance of the encapsulating layer is greater than a transmittance of the light absorbing layer and a transmittance of the reflective layer, and a reflectivity of the reflective layer is greater than a reflectivity of the light absorbing layer.

3. The display panel according to claim 2, wherein a top surface of the encapsulating layer has a plurality of protruding microstructures.

4. The display panel according to claim 2, wherein the light absorbing layer covers at least part of a side surface of the circuit substrate.

5. The display panel according to claim 2, wherein a vertical distance between a top surface of the encapsulating layer and the top surface of the light emitting diode is less than a vertical distance between a side surface of the encapsulating layer and the side surface of the light emitting diode closest to the side surface of the encapsulating layer.

6. The display panel according to claim 1, further comprising:
a black barrier structure, surrounding the reflective layer.

7. The display panel according to claim 6, further comprising:
a light absorbing layer, located on the reflective layer, wherein a material of the black barrier structure is different from a material of the light absorbing layer.

8. The display panel according to claim 1, wherein the reflective layer comprises:
a first base material, comprising an organic material; and
a plurality of reflective microstructures, distributed in the first base material, wherein the reflective microstructures comprise porous inorganic particles, hollow polymer particles, or air.

9. The display panel according to claim 8, further comprising:
a light absorbing layer, located on the reflective layer, wherein the light absorbing layer comprises:
a second base material, comprising a material same as or different from the first base material; and
a plurality of light absorbing particles, distributed in the second base material.

10. The display panel according to claim 9, wherein the reflective layer covers at least part of a side surface of the circuit substrate, wherein a vertical distance between a side surface of the light absorbing layer and the side surface of the circuit substrate is H3, a vertical distance between a side surface of the display panel and the side surface of the circuit substrate is H6, and 50%≤H3/H6≤100%.

11. The display panel according to claim 1, wherein the reflective layer is an anisotropic conductive film.

12. The display panel according to claim 1, wherein the insulating layer comprises a distributed Bragg reflector.

13. The display panel according to claim 1, wherein the insulating layer comprises AlN.

14. The display panel according to claim 1, wherein the insulating layer comprises $Al_2O_3$.

15. A manufacturing method of a display panel, comprising:
providing a circuit substrate;
placing a light emitting diode on the circuit substrate, wherein the light emitting diode comprises:
a first semiconductor layer, a light emitting layer, and a second semiconductor layer, wherein the light emitting layer is located between the first semiconductor layer and the second semiconductor layer, and the second semiconductor layer is located between the first semiconductor layer and the circuit substrate; and
an insulating layer contacting a side wall of the first semiconductor layer, a side wall of the light emitting layer, and a side wall of the second semiconductor layer; and
before or after placing the light emitting diode on the circuit substrate, forming a reflective layer on the circuit substrate, wherein taking a direction perpendicular to a top surface of the circuit substrate as a height direction, a horizontal height of a top surface of the reflective layer is located between a horizontal height of a top surface of the light emitting layer and a horizontal height of a top surface of the light emitting diode, wherein the reflective layer is in contact with a part of the light emitting diode, and a part of the reflective layer is located between the light emitting diode and the circuit substrate, wherein the insulating layer is laterally disposed between the side wall of the second semiconductor layer and the reflective layer, and wherein the insulating layer is laterally disposed between the side wall of the light emitting layer and the reflective layer.

16. The manufacturing method of the display panel according to claim 15, wherein before placing the light emitting diode on the circuit substrate, the reflective layer is formed on the circuit substrate, wherein the reflective layer comprises an anisotropic conductive film, and the light emitting diode is electrically connected to the circuit substrate through the reflective layer.

17. The manufacturing method of the display panel according to claim 15, wherein after placing the light emitting diode on the circuit substrate, the reflective layer is formed on the circuit substrate, and a method for forming the reflective layer comprises:
placing the light emitting diode and the circuit substrate in a mold;
filling a reflective material in the mold, wherein the reflective material is coated around the light emitting diode;
curing the reflective material;
removing the mold; and
executing an etching process on the cured reflective material to form the reflective layer exposing the top surface of the light emitting diode.

18. The manufacturing method of the display panel according to claim 17, further comprising:
executing a cleaning process on the top surface of the light emitting diode and the top surface of the reflective layer.

19. The manufacturing method of the display panel according to claim 15, wherein after placing the light emitting diode on the circuit substrate, the reflective layer is formed on the circuit substrate, and a method for forming the reflective layer comprises inkjet printing.

20. The manufacturing method of the display panel according to claim 15, further comprising:
forming a light absorbing layer on the reflective layer, wherein the light absorbing layer and the reflective layer are in contact with a side surface of the light emitting diode; and
forming an encapsulating layer on the light absorbing layer, wherein a transmittance of the encapsulating layer is greater than a transmittance of the light absorbing layer and a transmittance of the reflective layer, and a reflectivity of the reflective layer is greater than a reflectivity of the light absorbing layer.

* * * * *